United States Patent
Yoo et al.

(10) Patent No.: US 11,063,150 B2
(45) Date of Patent: Jul. 13, 2021

(54) SEMICONDUCTOR DEVICES

(71) Applicant: Samsung Electronics Co., Ltd., Suwon-si (KR)

(72) Inventors: Sang-Min Yoo, Suwon-si (KR); Byung-Sung Kim, Suwon-si (KR); Ju-Youn Kim, Suwon-si (KR); Bong-Seok Suh, Seoul (KR); Hyung-Joo Na, Seoul (KR); Sung-Moon Lee, Suwon-si (KR); Joo-Ho Jung, Suwon-si (KR); Eui-Chul Hwang, Seoul (KR)

(73) Assignee: SAMSUNG ELECTRONICS CO. LTD., Gyeonggi-do (KR)

( * ) Notice: Subject to any disclaimer, the term of this patent is extended or adjusted under 35 U.S.C. 154(b) by 75 days.

(21) Appl. No.: 16/413,503

(22) Filed: May 15, 2019

(65) Prior Publication Data
US 2020/0105919 A1    Apr. 2, 2020

(30) Foreign Application Priority Data
Sep. 28, 2018    (KR) .................. 10-2018-0116275

(51) Int. Cl.
*H01L 29/78*    (2006.01)
*H01L 21/762*    (2006.01)
*H01L 29/66*    (2006.01)

(52) U.S. Cl.
CPC ...... *H01L 29/785* (2013.01); *H01L 21/76224* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| 8,901,615 | B2 | 12/2014 | Moroz |
| 9,219,153 | B2 | 12/2015 | Xie et al. |
| 9,831,272 | B2 | 11/2017 | Chen et al. |
| 9,865,704 | B2 | 1/2018 | Xie et al. |
| 2017/0047636 | A1 | 2/2017 | Lee et al. |
| 2017/0062475 | A1* | 3/2017 | Song ............... H01L 22/20 |

(Continued)

FOREIGN PATENT DOCUMENTS

KR    10-2017-0085177 A    7/2017

*Primary Examiner* — Nicholas J Tobergte
*Assistant Examiner* — Kien C Ly
(74) *Attorney, Agent, or Firm* — Muir Patent Law, PLLC

(57) ABSTRACT

A semiconductor device may include active fins each of which extends in a first direction on a substrate, the active fins being spaced apart from each other in a second direction different from the first direction, a conductive structure extending in the second direction on the substrate, the conductive structure contacting the active fins, a first diffusion break pattern between the substrate and the conductive structure, the first diffusion break pattern dividing a first active fin of the active fins into a plurality of pieces aligned in the first direction, and a second diffusion break pattern adjacent to the conductive structure on the substrate, the second diffusion break pattern having an upper surface higher than a lower surface of the conductive structure, and dividing a second active fin of the active fins into a plurality of pieces aligned in the first direction.

19 Claims, 34 Drawing Sheets

(56) References Cited

U.S. PATENT DOCUMENTS

| | | |
|---|---|---|
| 2017/0200651 A1 | 7/2017 | Lee et al. |
| 2017/0365674 A1 | 12/2017 | Lee et al. |
| 2018/0040621 A1 | 2/2018 | Liaw |
| 2019/0221469 A1* | 7/2019 | Hsu .................. H01L 21/76224 |

* cited by examiner

SEMICONDUCTOR DEVICES

CROSS-REFERENCE TO RELATED APPLICATION

This application claims priority under 35 USC § 119 to Korean Patent Application No. 10-2018-0116275, filed on Sep. 28, 2018 in the Korean Intellectual Property Office (KIPO), the contents of which are herein incorporated by reference in their entirety.

BACKGROUND

1. Field

Example embodiments relate to a semiconductor device. More particularly, example embodiments relate to a semiconductor device including a finFET.

2. Description of the Related Art

A diffusion break pattern may be formed for an electrical insulation between standard cells, or between certain neighboring regions even in the same standard cell. The diffusion break pattern may include removing a portion of the active fin. The diffusion break pattern may apply a stress to the active fin depending on the material thereof, and thus may change the characteristics of a transistor formed with the active fin.

SUMMARY

Example embodiments provide a semiconductor device having improved characteristics.

According to example embodiments, there is provided a semiconductor device. The semiconductor device may include active fins each of which extends in a first direction on a substrate, the active fins being spaced apart from each other in a second direction different from the first direction, a conductive structure extending in the second direction on the substrate, the conductive structure contacting the active fins, a first diffusion break pattern between the substrate and the conductive structure, the first diffusion break pattern dividing a first active fin of the active fins into a plurality of pieces aligned in the first direction, and a second diffusion break pattern adjacent to the conductive structure on the substrate, the second diffusion break pattern having an upper surface higher than a lower surface of the conductive structure, and dividing a second active fin of the active fins into a plurality of pieces aligned in the first direction.

In some examples, the second diffusion break pattern contact an end of the conductive structure that faces the second direction.

In some examples, the second diffusion break pattern may include a portion formed between portions of the conductive structures.

In a semiconductor device according to example embodiments, active fins of an NMOS region may be separated and electrically insulated by a first diffusion break pattern formed of an oxide, and active fins of a PMOS region may be separated and electrically insulated by a second diffusion break pattern formed of a nitride. Accordingly, a tensile stress and a compression stress may be applied to channels of an NMOS transistor and a PMOS transistor, respectively, and the electrical performance of the channels may be improved.

However, the effects of the present invention should not be considered to be limited to the above-described effects, and may be variously extended without departing from the spirit and the scope of the present invention.

DESCRIPTION OF EMBODIMENTS

A semiconductor device in accordance with example embodiments will be described more fully hereinafter with reference to the accompanying drawings.

Hereinafter, two directions intersecting with each other and substantially parallel to an upper surface of a substrate of the semiconductor device are referred to as first and second directions, and a vertical direction substantially perpendicular to the upper surface of the substrate is referred to as a third direction. In example embodiments, the first and second directions may be substantially orthogonal to each other.

FIGS. 1 to 21 are plan views and cross-sectional views illustrating a method of manufacturing a semiconductor device in accordance with example embodiments.

Specifically, FIGS. 1, 3, 5, 9, 13, 16, 22, 24, 26, 29, 31 and 33 are the plan views, and FIGS. 2, 4, 6-8, 10-12, 14-15, 17-19, 20A, 20B, 21, 23, 25, 27, 28 and 30 are the cross-sectional views.

Figure 6:
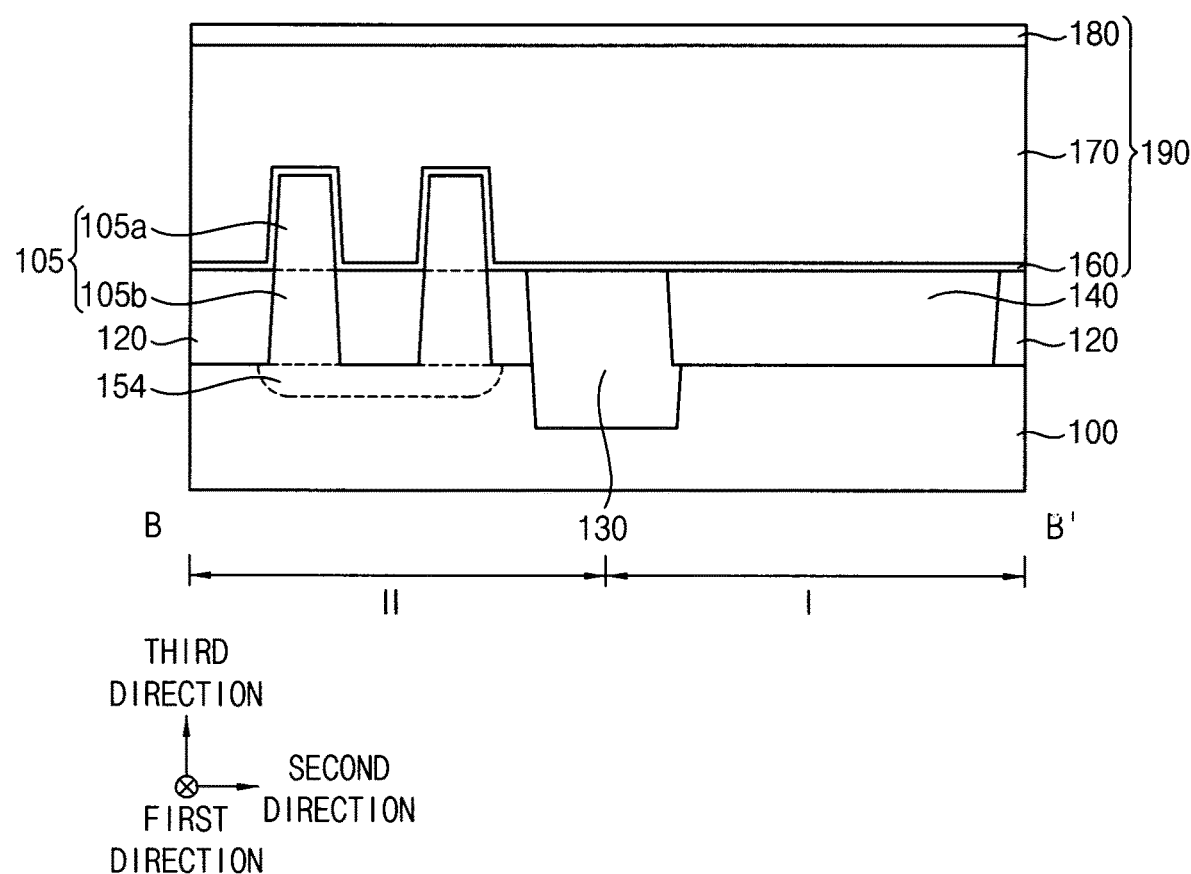
Figure 18:
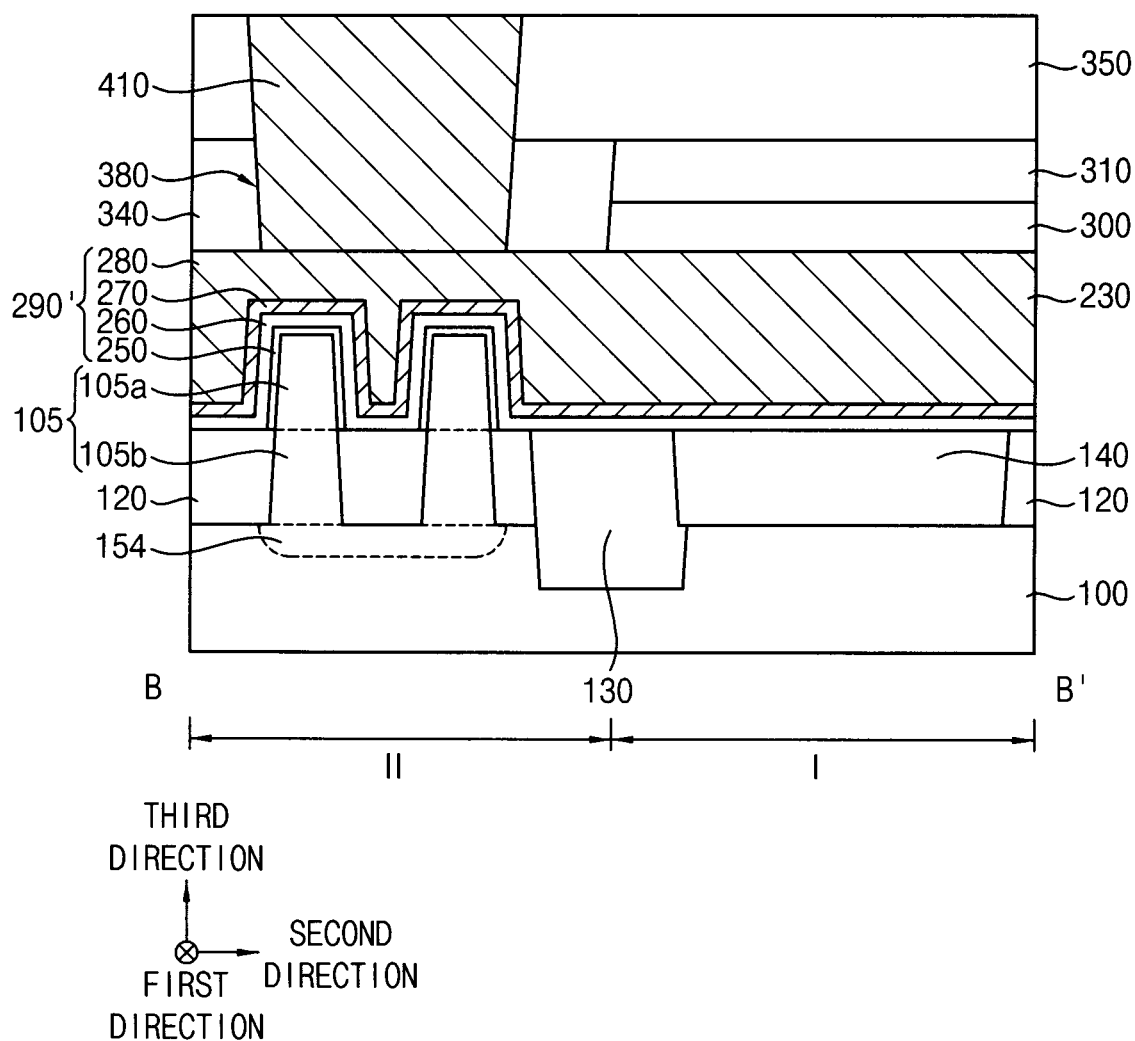
Figure 19:
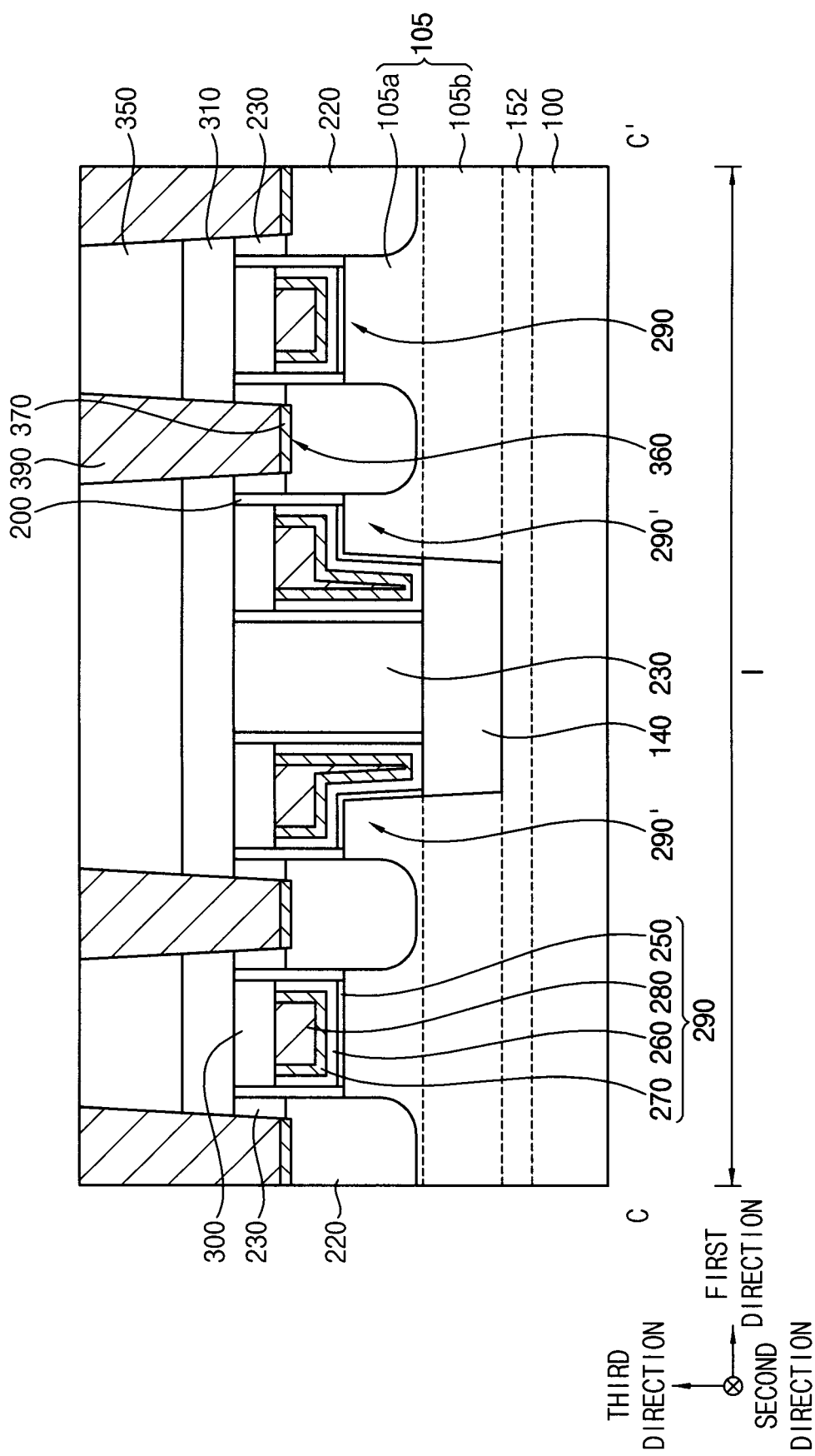
Figure 20A:
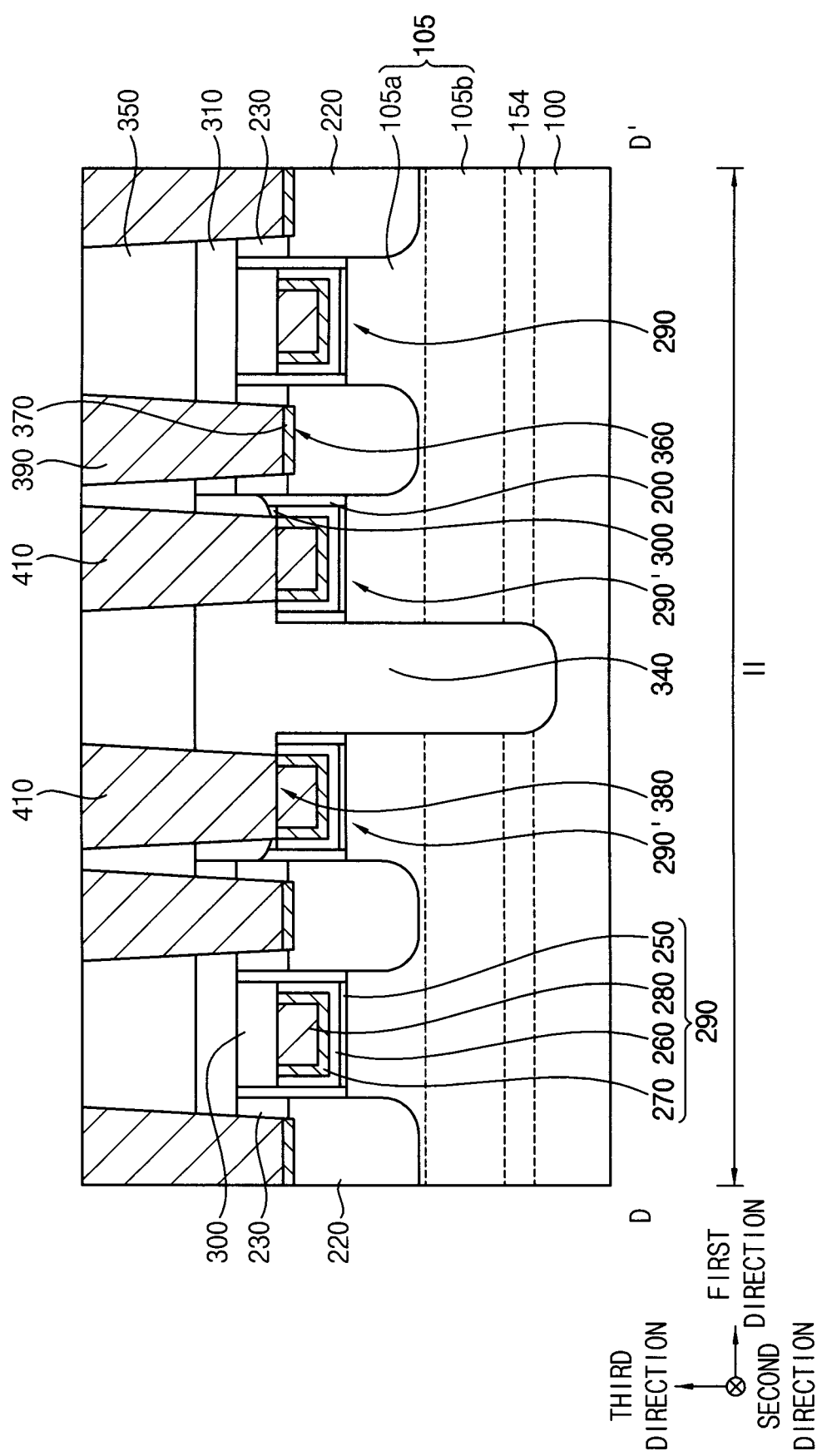
Figure 20B:
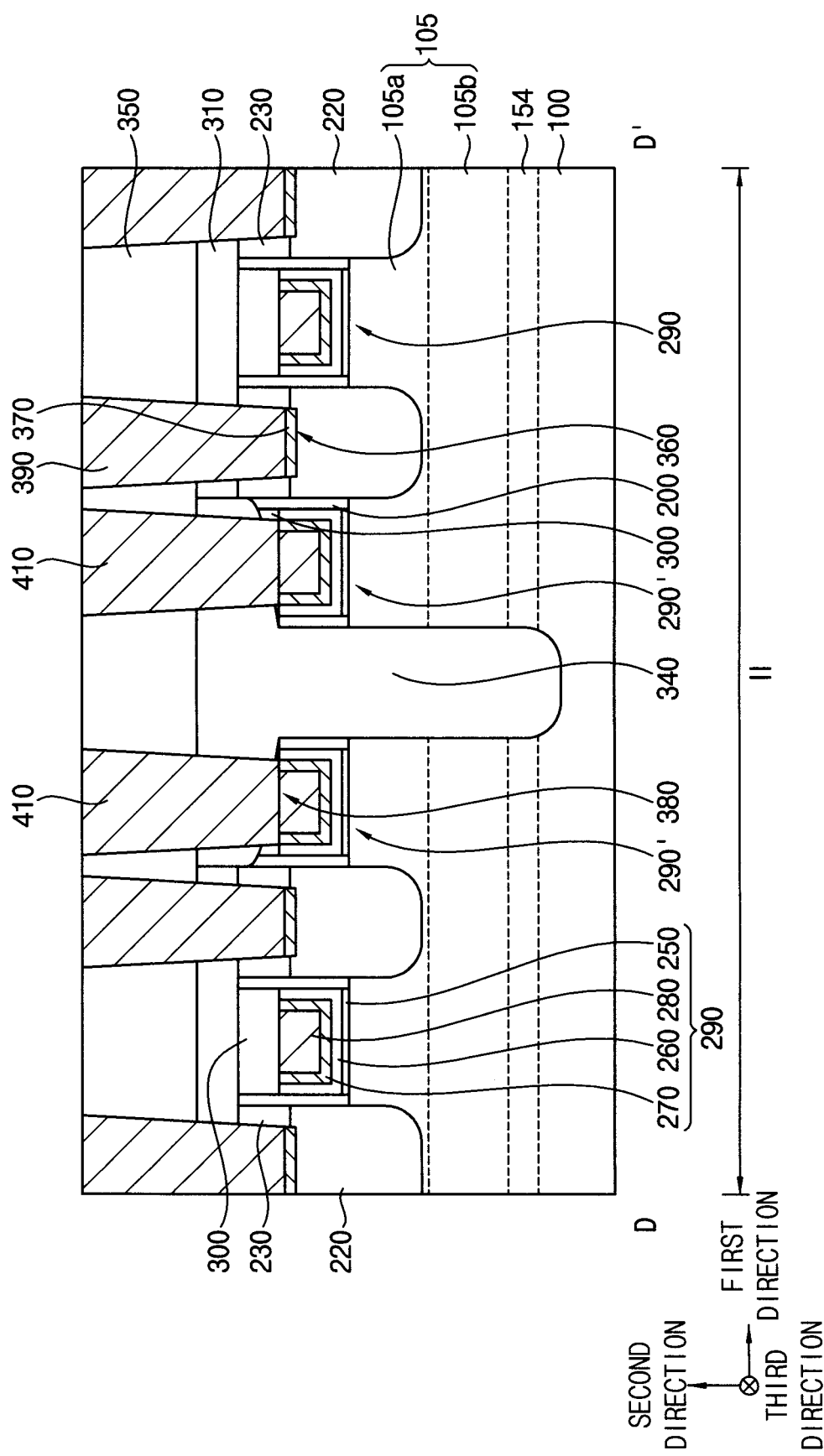
Figure 21:
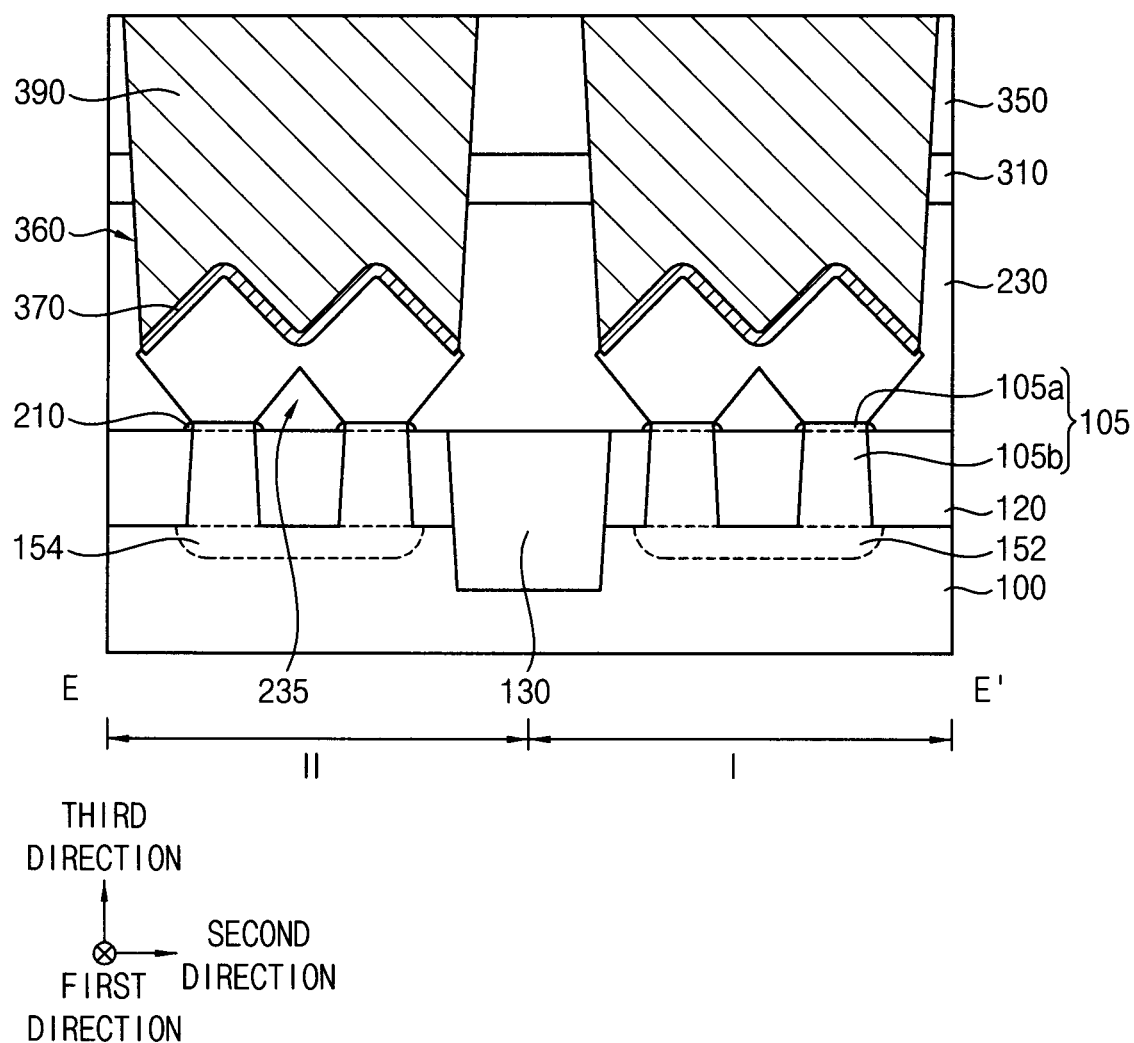
Figure 25:
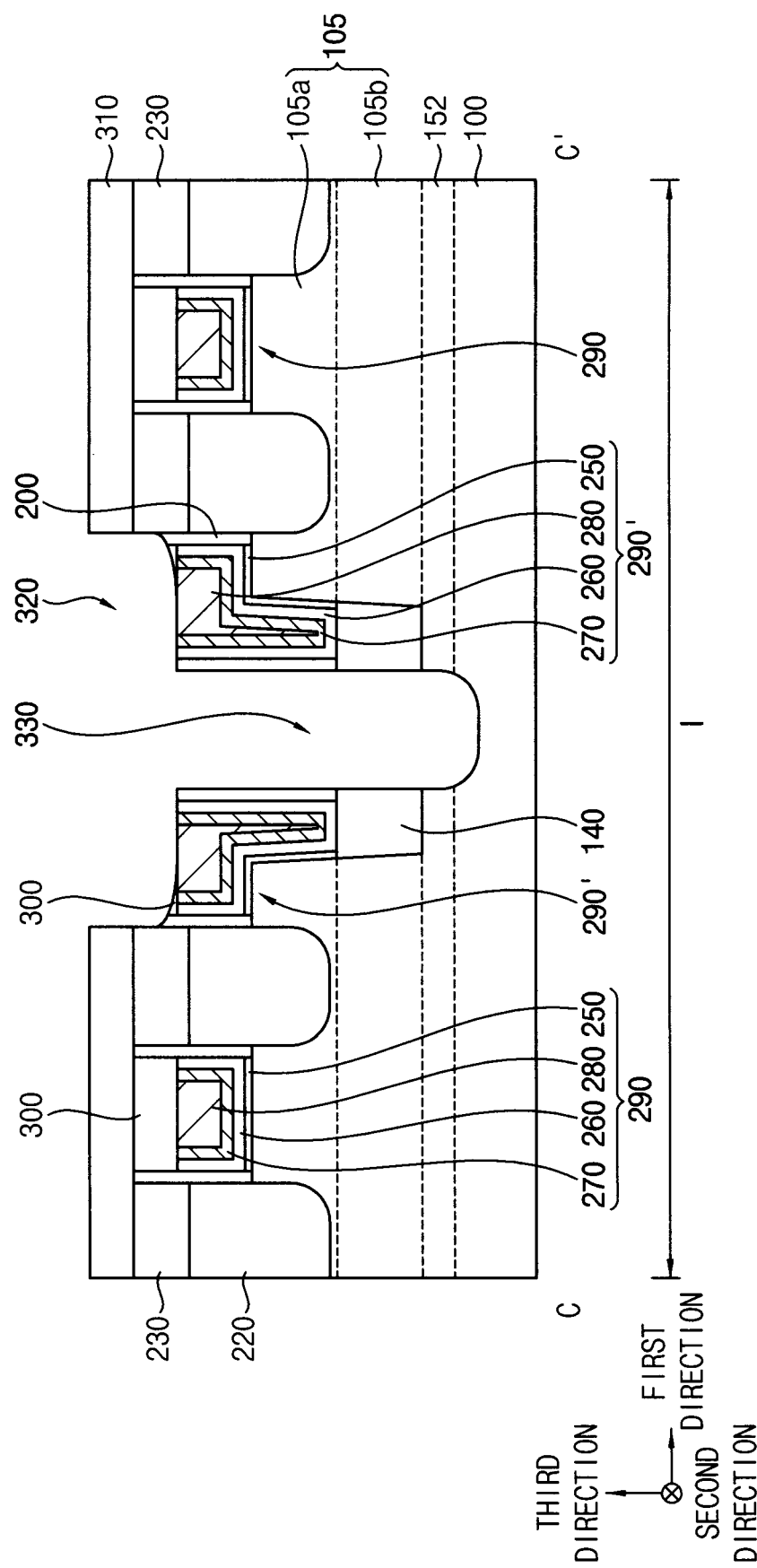
Figure 26:
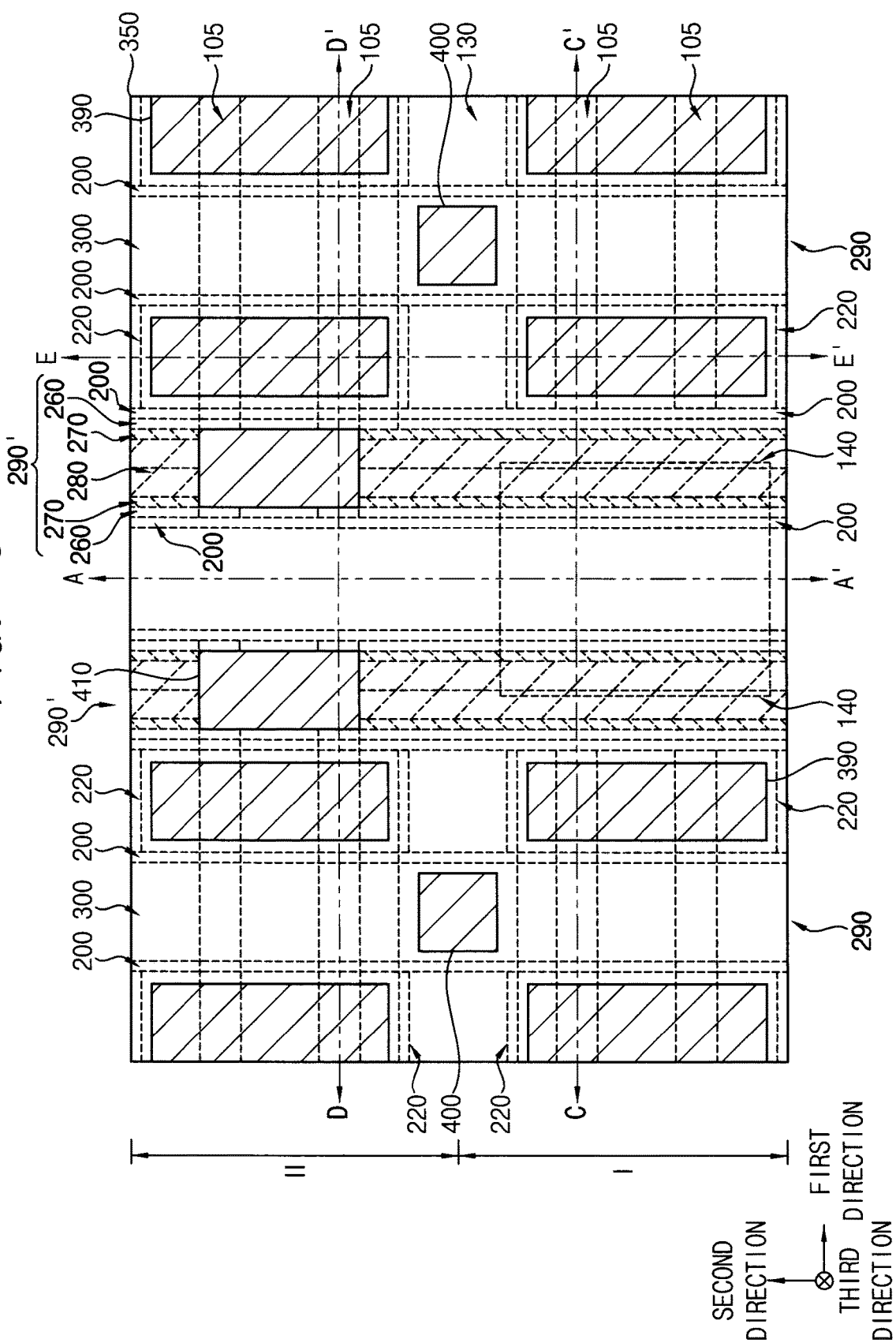

FIGS. 2, 4, 10, 17, 25 are cross-sectional views taken along lines A-A' of respective corresponding plan views, FIGS. 6, 18 and 26 are cross-sectional views taken along lines B-B' of respective corresponding plan views, FIGS. 7, 11-12, 19 and 27 are cross-sectional views taken along lines C-C' of respective corresponding plan views, respectively, FIGS. 8, 14-15, 20A, 20B, 23, 28, 30 and 32 are cross-sectional views taken along lines D-D' of respective corresponding plan views, and FIG. 21 is a cross-sectional view taken along a line E-E' of a corresponding plan view.

Figure 1:
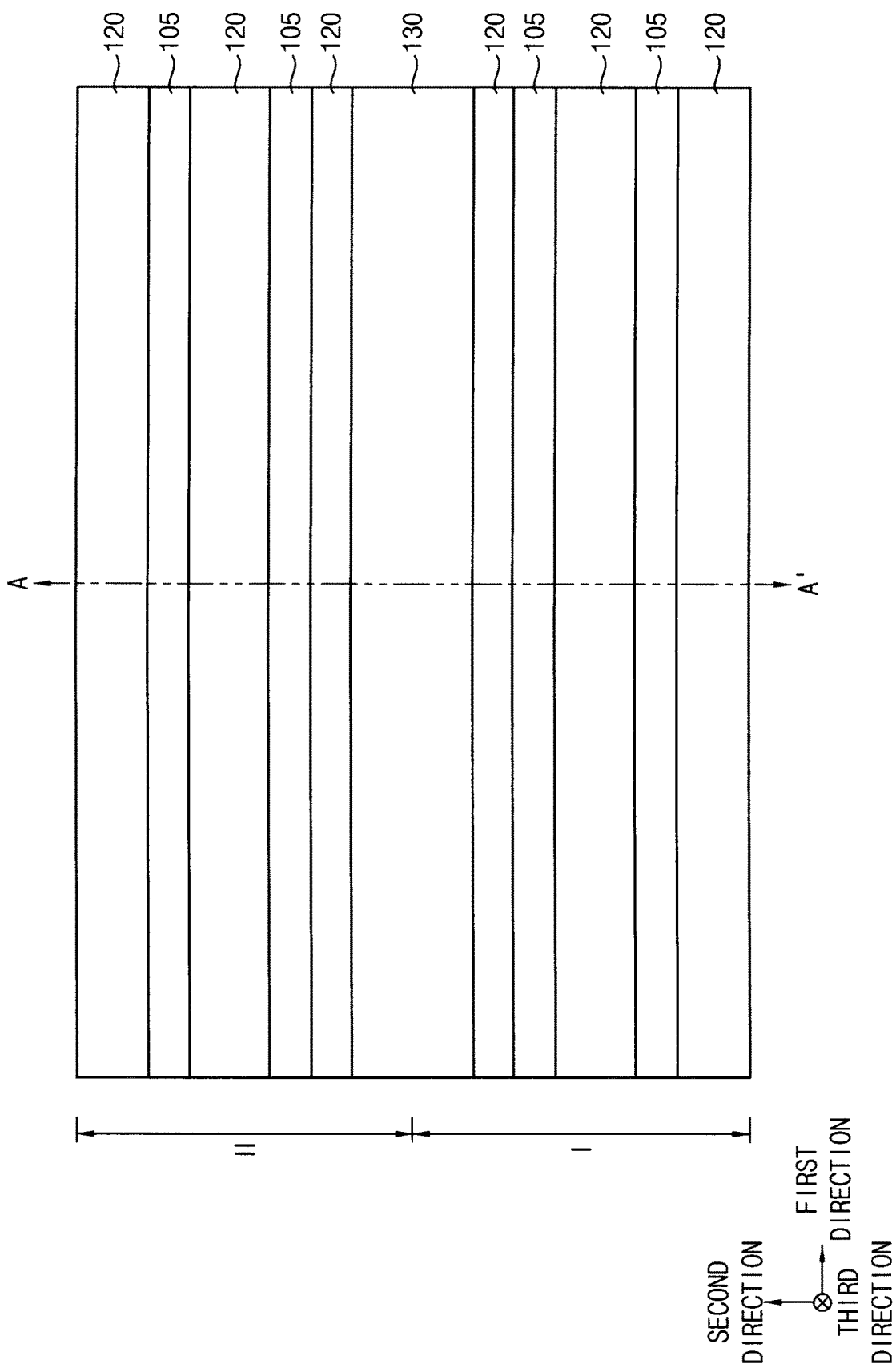
FIGS. 1 to 19, 20A, 20B and 21 are plan views and cross-sectional views illustrating a method of manufacturing a semiconductor device in accordance with example embodiments.
Figure 2:
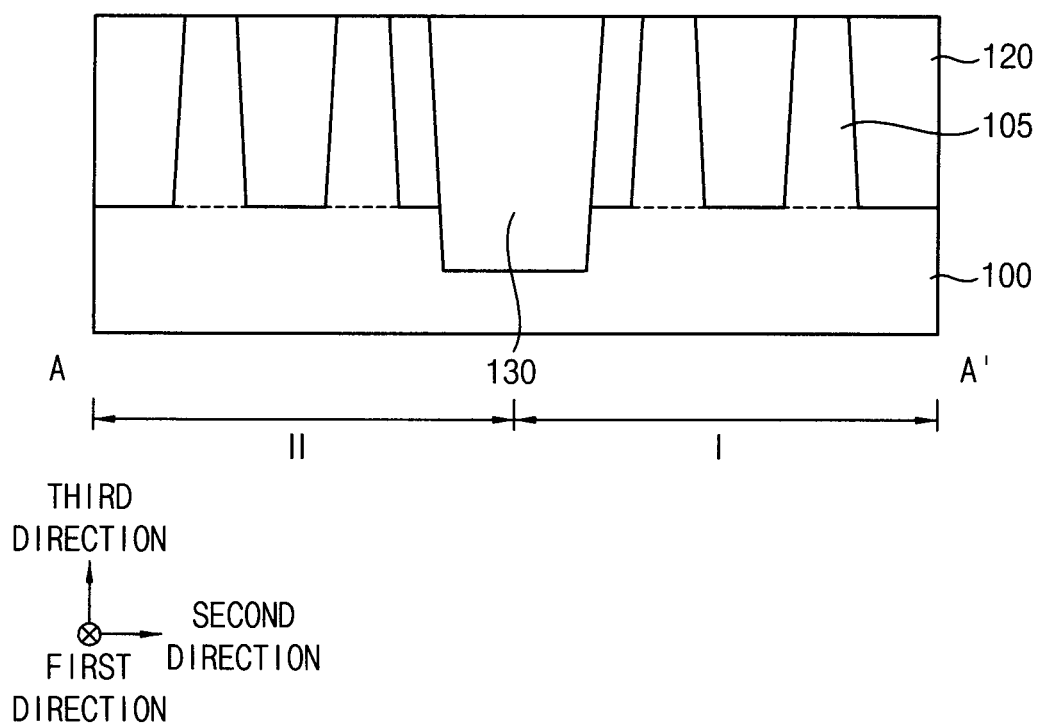

Referring to FIGS. 1 and 2, a substrate 100 may be provided with a plurality of protruding active fins 105. Active fins 105 may be formed by etching a plurality of recesses (e.g., trenches extending in the first direction) in an upper portion of a substrate 100, including in the first and second regions I and II. Active fins 105 may also be formed by forming an insulating layer on substrate 100, etching a plurality of trenches in the insulating layer to expose the top surface of the substrate 100 (e.g., corresponding to first isolation pattern 120), and epitaxially growing the plurality of the active fins 105 from the top surface of the substrate 100 within the plurality of trenches. Reference to a substrate provided with active fins will be understood to generically refer to the structure resulting from both of these processes.

The substrate 100 may be formed of semiconductor materials, and may be e.g., crystalline silicon, crystalline germanium, crystalline silicon-germanium, etc., or III-V compounds e.g., crystalline GaP, crystalline GaAs, crystalline GaSb, etc. In some embodiments, the substrate 100 may be a silicon-on-insulator (SCSI) substrate or a germanium-on-insulator (GOI) substrate.

In example embodiments, the first region I of the substrate 100 may be an NMOS region in which negative-channel metal oxide semiconductor (NMOS) transistors are to be formed, and the second region II of the substrate 100 may be a PMOS region in which positive-channel metal oxide semiconductor (PMOS) transistors are to be formed. The first and second regions I and II may be arranged in the second direction.

In this example embodiment, each of the active fins 105 extends in the first direction, and the plurality of active fins 105 may be formed side by side in the second direction. The active fins 105 on the first region I of the substrate 100 are referred to as first active fins, and the active fins 105 on the second region II of the substrate 100 are referred to as second active fins.

A first isolation layer may be formed on the substrate 100 to cover the active fins 105 and fill the first recess, and the first isolation layer may be planarized until upper surfaces of the active fins 105 may be exposed to form a first isolation pattern 120 covering sidewalk of the active fins 105. The first isolation pattern 120 may include an oxide, e.g., silicon oxide.

In example embodiments, the planarization process may include a chemical mechanical polishing (CMP) process and/or an etch back process. It will be appreciated that "planarization," "co-planar," "planar," etc., as used herein refer to structures (e.g., surfaces) that need not be perfectly geometrically planar, but may include acceptable variances that may result from standard manufacturing processes.

A first etching mask (not shown) may be formed over the resulting structure. The first etching mask may have an opening extending in the first direction. The opening of the first etching mask may correspond to second isolation pattern 130 (to be formed subsequently) and expose one or more of the active fins 105. An etching process may remove the exposed one or more of the active fins 105, portions of the first isolation pattern 120 adjacent thereto and an upper portion of the substrate 100 under the exposed one or more of the active fins 105 and under the portions of the removed first isolation pattern 120 to form a second recess. A second isolation pattern 130 may be formed to fill the second recess.

In this example, the second isolation pattern 130 extends in the first direction. In addition, although not shown in FIGS. 1 and 2, the process described with respect to this example may also comprise forming a plurality of such second isolation patterns 130 at various portions of the semiconductor device, such as being formed a plurality of such second isolation patterns 130 side by side in second direction (e.g. in a region initially having a continuous and regular distribution of active fins 105). In the example of FIG. 2, one of the active fins 105 at a boundary between the first and second regions I and II of the substrate 100 is removed in forming the second isolation pattern 130, however, the inventive concept is not be limited thereto and a plurality of active fins 105 (e.g. side by side with respect to the cross section of FIG. 2) may be removed in forming second isolation pattern 130.

The lower surface of the second isolation pattern 130 may be lower than a lower surface of the first isolation pattern 120. The second isolation pattern 130 may be an oxide, e.g., silicon oxide and/or a nitride, e.g., silicon nitride. In one embodiment, the material of the second isolation pattern 130 may be the same as that of the first isolation pattern 120, and thus may be merged with the first isolation pattern 120.

Figure 3:
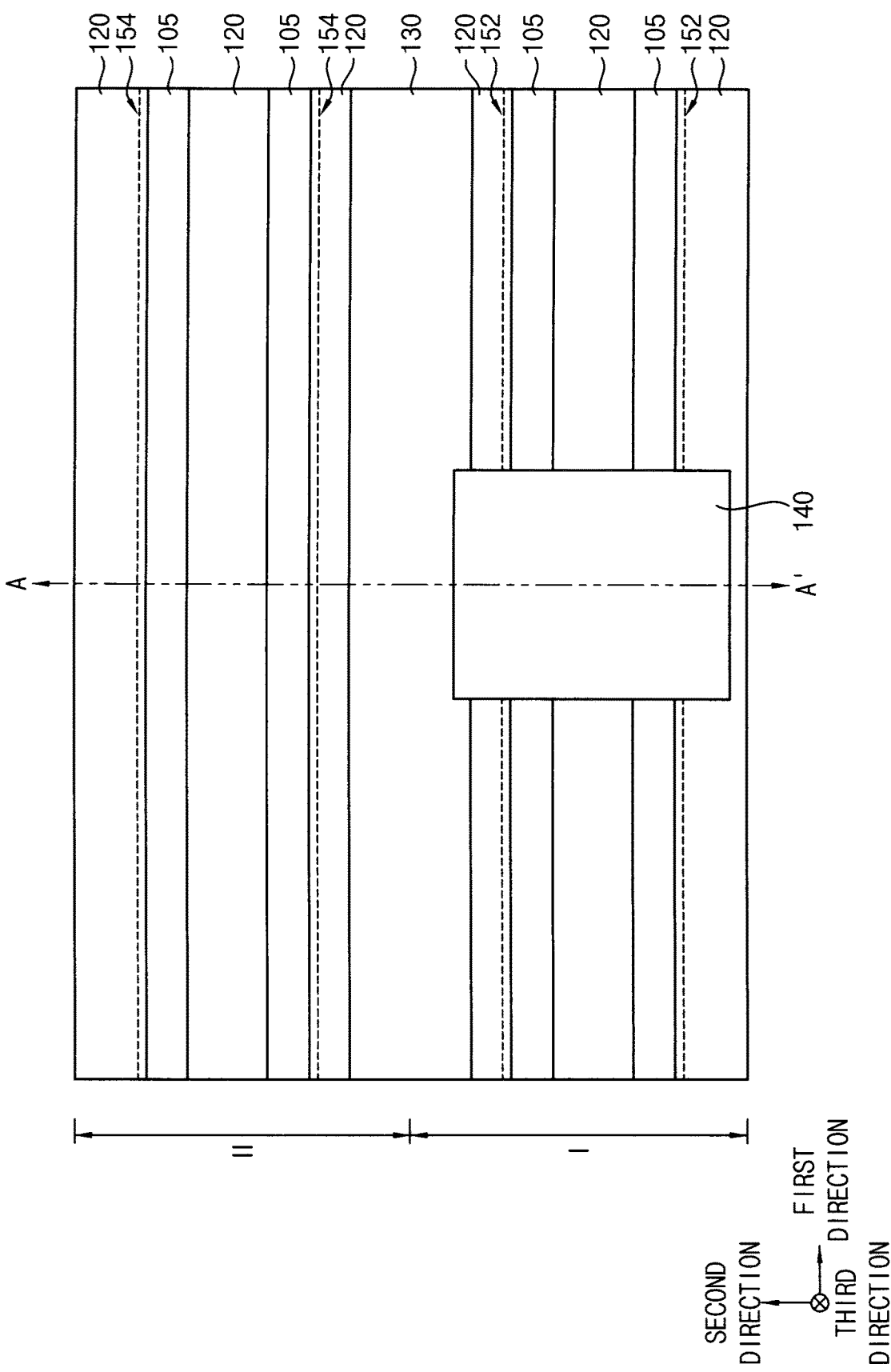
Figure 4:
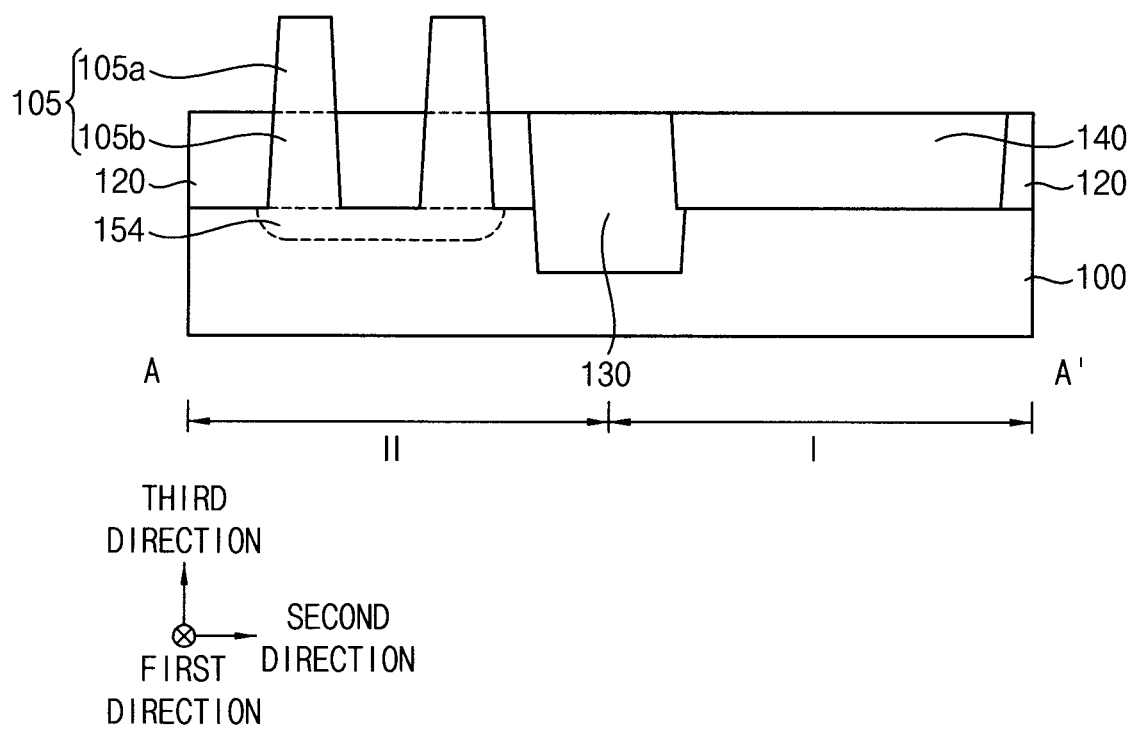
Figure 5:
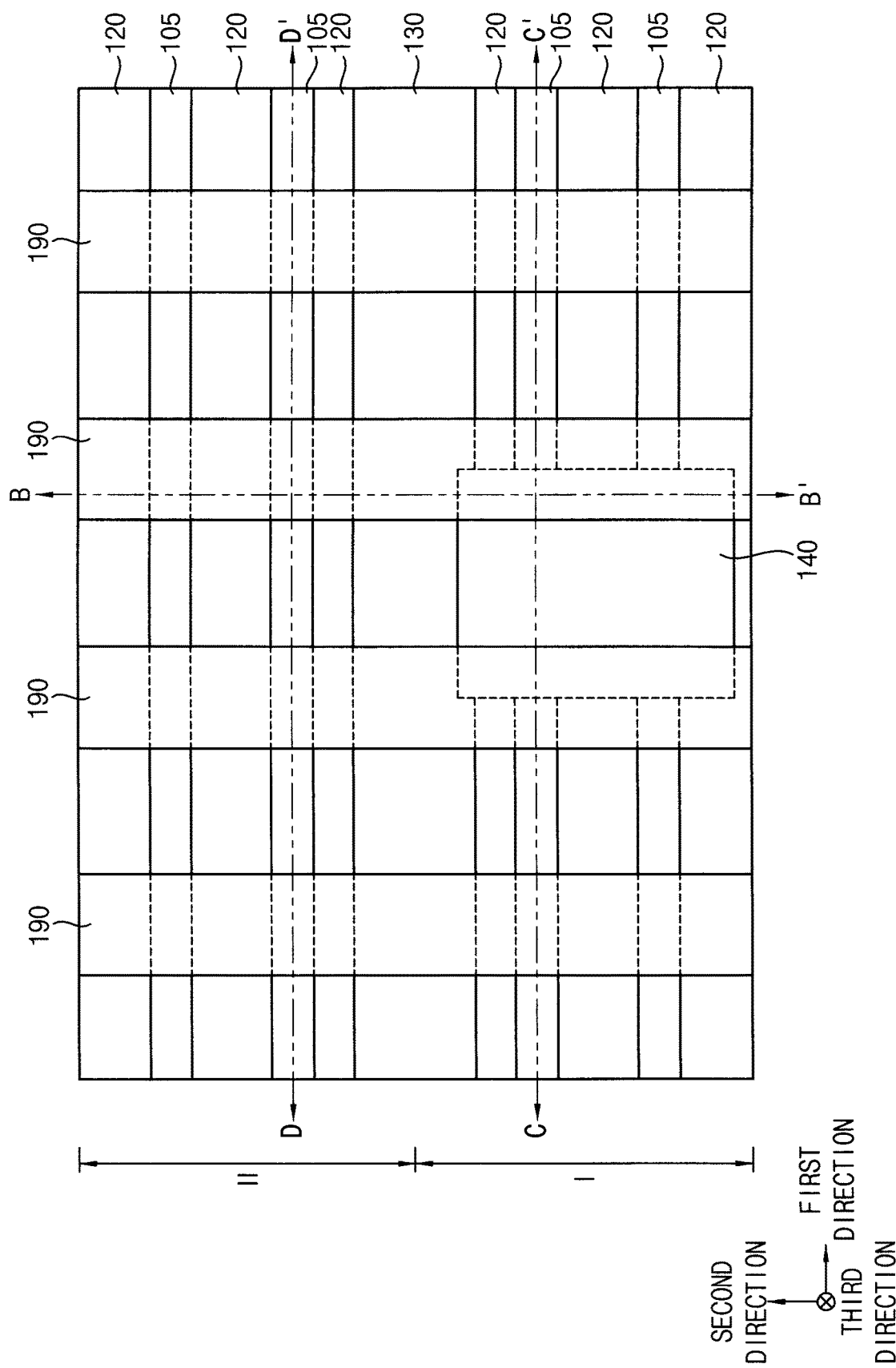

Referring to FIGS. 3 and 4, a first diffusion break pattern 140 is formed that extends through at least one of the active fins 105 in the first region I of the substrate 100. The first diffusion break pattern 140 may extend through at least one of the first active fins to divide the first active fin(s) into a plurality of pieces, e.g., two separated pieces of a first active fin aligned and extending in the first direction are formed for each active fin 105 through which the first diffusion break pattern 140 is formed.

After performing an etching process using a second etching mask (not shown) having an opening corresponding to the first diffusion break pattern 140 to be formed, portions of the first active fins) and portions of the first isolation pattern 120 exposed by the opening of the second etching mask are removed to form a third recess. The first diffusion break pattern 140 may be formed to fill the third recess. In this example, a portion of the second isolation pattern 130 is also exposed by the opening of the second etching mask and has a portion removed during the etching process to form the third recess. As shown in FIG. 4, the first diffusion break pattern 140 may contact the second isolation pattern 130. After etching using the second etching mask and removing the second mask, the first diffusion break pattern 140 may be formed by blanket depositing material of the first diffusion break pattern 140 over the resulting structure (including in the third recess) and performing a planarization process until top surfaces of active fins 105 are exposed, thus removing portions of the material of the first diffusion break pattern 140 over the active fins 105 and leaving the deposited material within the third recess to form the first diffusion break pattern 140. Subsequently, an etch back process may be formed to remove upper portions of the first and second isolation patterns 120 and 130 and an upper portion the first diffusion break pattern 140 so that upper portions of the active fins 105 protrude above the remaining portions of the first and second isolation patterns 120 and 130 and the first diffusion break pattern 140 (see FIG. 4), exposing sidewalls of upper portions of the active fins 105.

FIG. 4 illustrates that the first diffusion break pattern 140 is formed to extend in the second direction to penetrate through two of the first active fins, however, the inventive concept is not be limited thereto.

In example embodiments, a lower surface of the first diffusion break pattern 140 may extend to or past the bottom of (e.g. below) the first active fins 105. Each of the first active fins extending through which the diffusion break pattern 140 extends may be divided into a plurality of pieces, e.g., two pieces by the first diffusion break pattern 140. The first diffusion break pattern 140 may be formed of an oxide, e.g., silicon oxide. The material of first diffusion break pattern 140 may the same as that of the first isolation pattern 120 and/or the second isolation pattern 130, both of which may contact the first diffusion break pattern 140, and be merged thereto.

Each of the active fins 105 may include a lower active pattern 105b and an upper active pattern 105a. Sidewalls of the lower active patterns 105b may be covered by the first isolation pattern 120. The upper active patterns 105a protrude upwardly from the first isolation pattern 120 and the first diffusion break pattern 140 in the third direction.

First and second impurity regions 152 and 154 may be formed in the first and second regions I and II, respectively, of the substrate 100. The first impurity region 152 may be formed in first active fins 105 and extend below the first active fins 105 into substrate 100. The second impurity region 154 may be formed in second active fins 105 and extend below the second active fins 105 into substrate 100. The first and second impurity regions 152 and 154 may be formed by selectively doping p-type and n-type impurities, respectively (e.g., separately doping each region while masking the other region). Doping of the first and second impurity regions 152 and 154 may be performed at various stages of the process, such as prior to forming active fins 105, immediately after forming active fins, etc.

Referring to FIGS. 5 to 8, a dummy gate structure 190 may be formed on the substrate 100. A dummy gate insulation layer, a dummy gate electrode layer and a dummy gate mask layer may be sequentially formed on the active fins 105, the first and second isolation patterns 120 and 130, and the first diffusion break pattern 140. The dummy gate mask layer may be etched using a third etching mask (e.g., photoresist mask—not shown) to form dummy gate mask 180. The dummy gate electrode layer and the dummy gate insulation layer may be etched using the dummy gate mask 180 as an etching mask to form the dummy gate structure 190. Accordingly, the dummy gate structure 190 may include a dummy gate insulation pattern 160, a dummy gate electrode 170 and the dummy gate mask 180 sequentially stacked.

The dummy gate insulation layer, the dummy gate electrode layer, and the dummy gate mask layer may be formed by, e.g., a chemical vapor deposition (CVD) process, an atomic layer deposition (ALD) process, etc. The dummy gate insulation layer may be or include an oxide, e.g., silicon oxide, the dummy gate electrode layer may be or include, e.g., polysilicon, and the dummy gate mask layer may be or include a nitride, e.g., silicon nitride.

Figure 7:
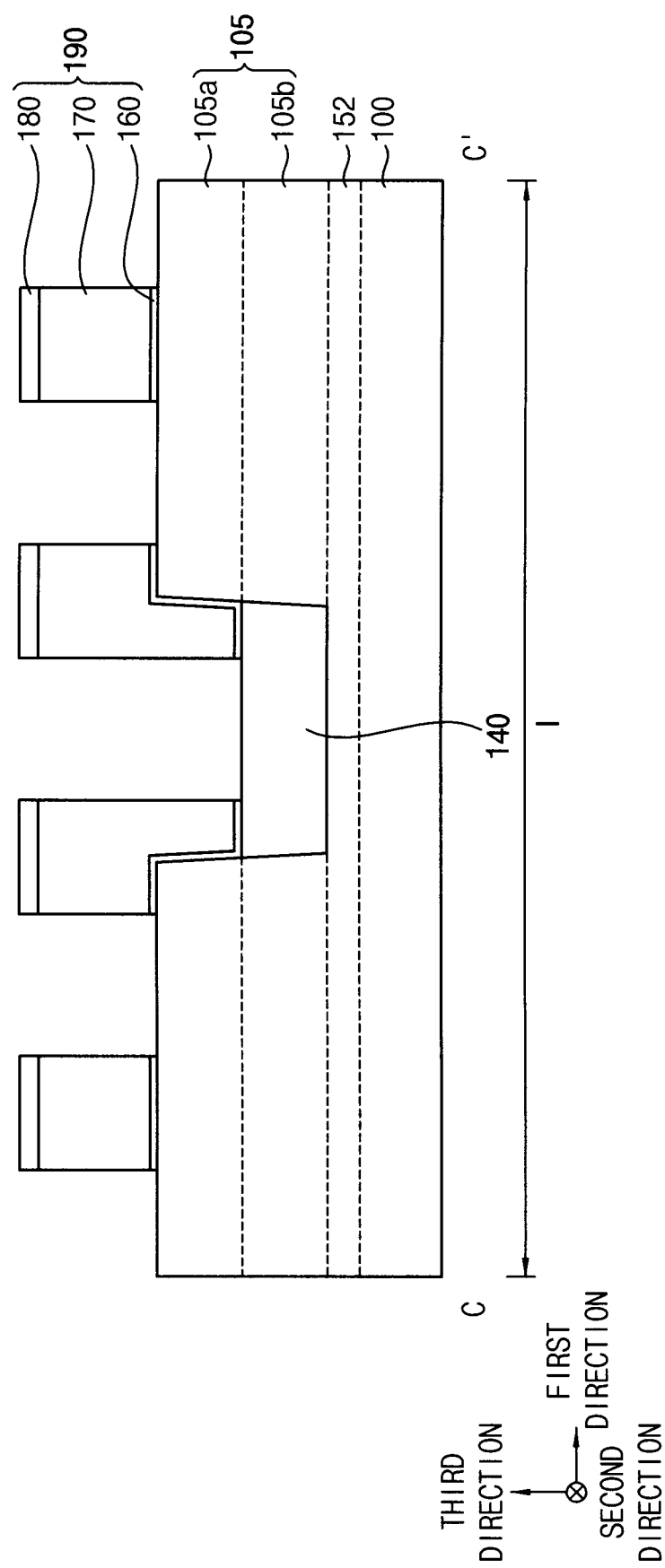
Figure 8:
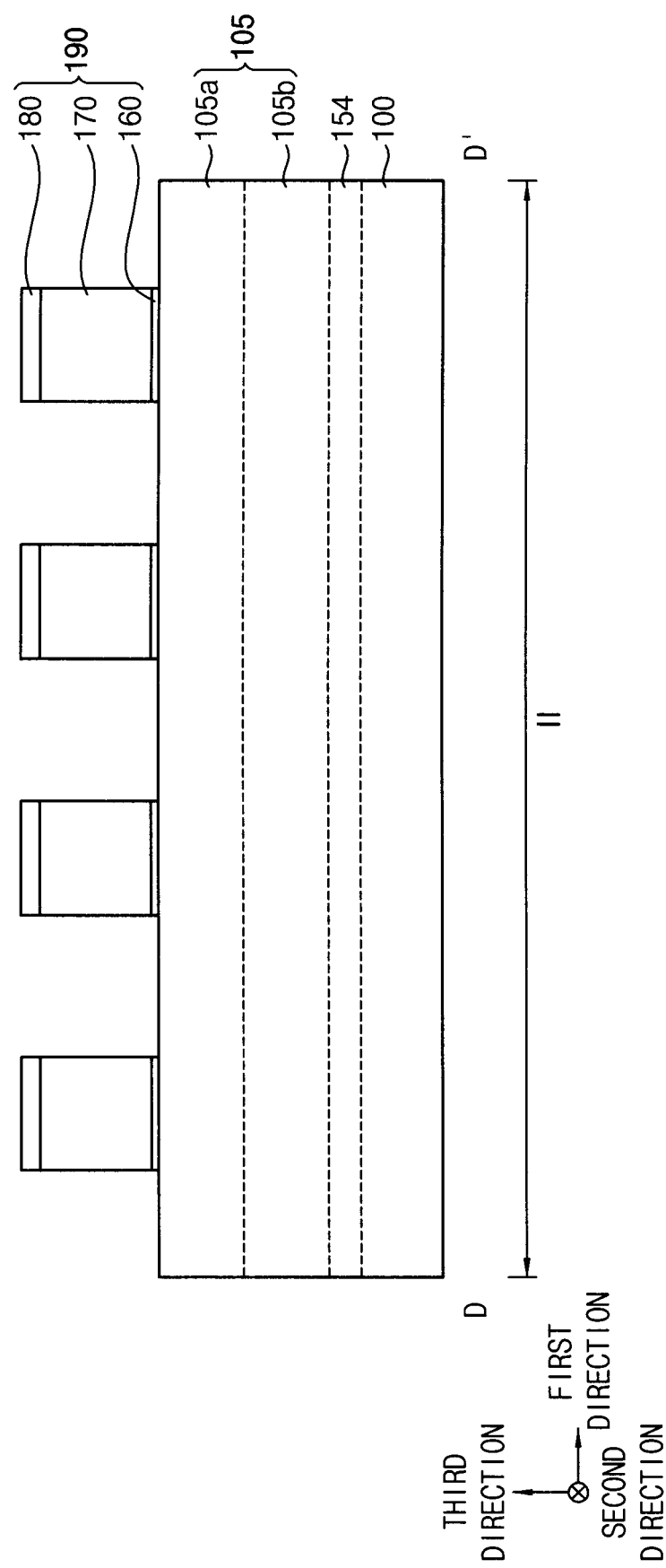

In this example, each dummy gate structure 190 extends in the second direction. A plurality of dummy gate structures 190 may be formed side by side in the first direction. One or more first dummy gate structures of the dummy gate structures 190 may be formed on the active fins 105, the first and second isolation patterns 120 and 130, and the first diffusion break pattern 140. The two central dummy gate structures 190 in FIG. 7 are examples of two such first dummy gate structures, with FIG. 6 showing a vertical cross section of one of these first dummy gate structures (taken along B-B' in FIG. 5). One or more second dummy gate structure of the dummy gate structures 190 may be formed on the active fins 105, and the first and second isolation patterns 120 and 130 but not on the first diffusion break pattern 140. The two outer dummy gate structures 190 in FIGS. 7 and 8 are examples of two such second dummy gate structures, with FIG. 6 showing a vertical cross section of one of these first dummy gate structures taken along the length of this first dummy gate structure (taken along B-B' in FIG. 5). FIG. 7 illustrates two neighboring first dummy gate structures extending across the first diffusion break pattern, however, the invention may also be implemented with one or three or more neighboring first dummy gate structures extending across a first diffusion break pattern 140.

In example embodiments, on the first region I of the substrate 100, a portion of a lower surface of each of the first dummy gate structures may contact the first active fins, and another portion thereof may contact the first diffusion break pattern 140. An upper surface of the first diffusion break pattern 140 may be lower than an upper surface of the first active fin, and thus the lower surface of each of the first dummy gate structures may have a staircase shape.

Figure 9:
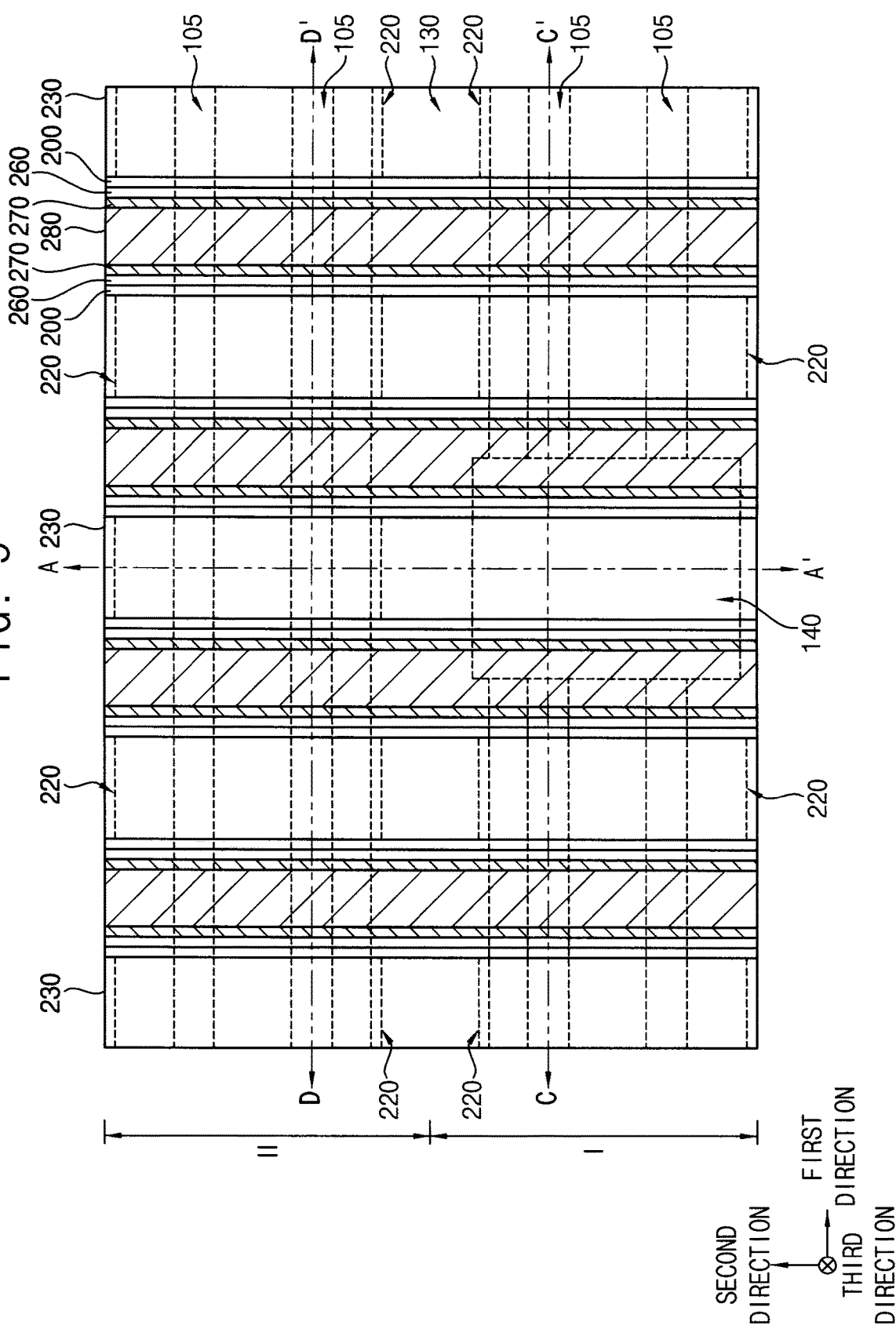
Figure 10:
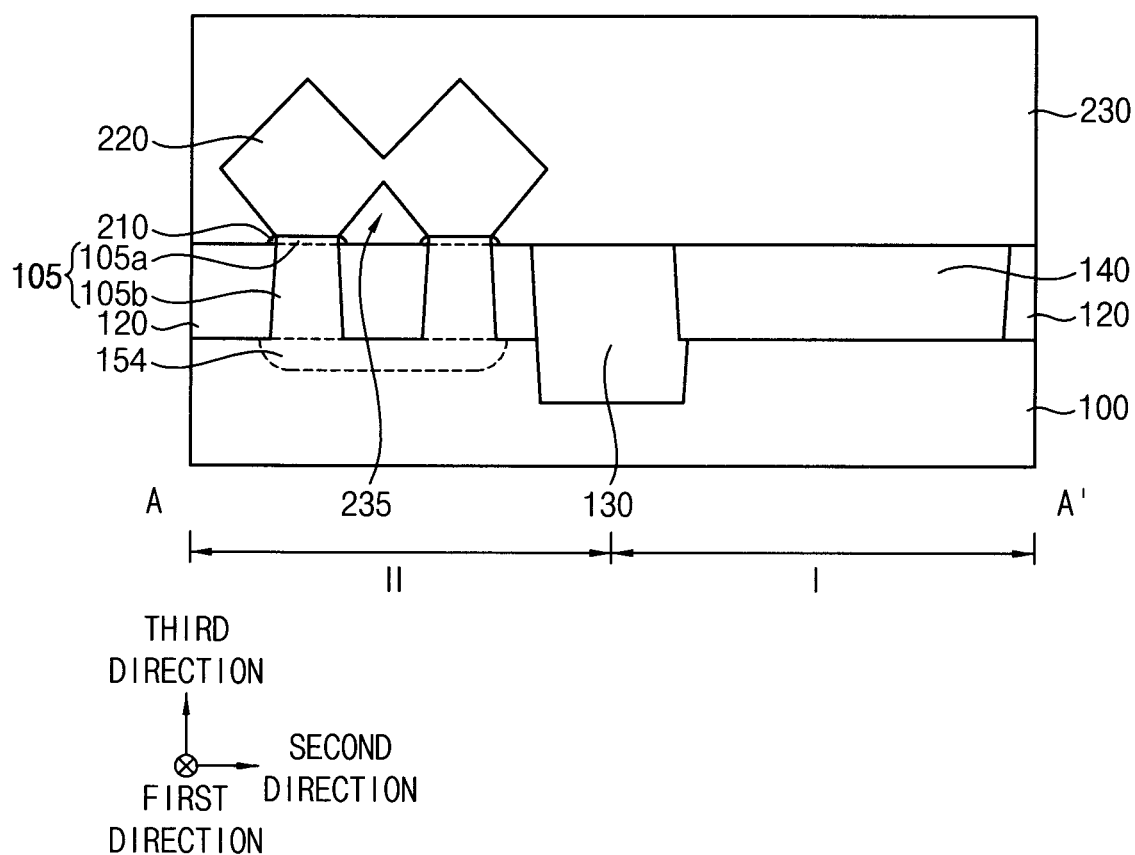
Figure 11:
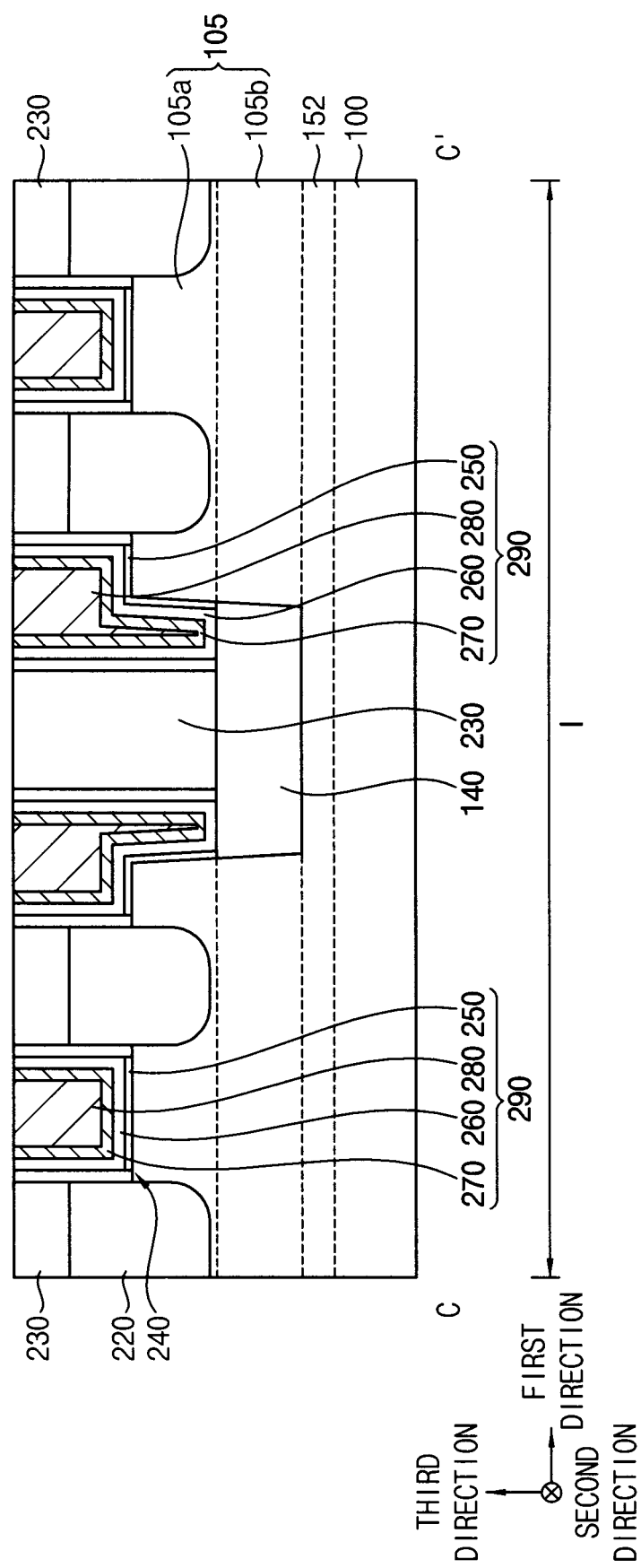

Referring to FIGS. 9 to 11, a gate spacer 200 may be formed on a sidewall of the dummy gate structure 190, and a fin spacer 210 may be formed on a sidewall of each of the active fins 105. In example embodiments, the gate spacer 200 and the fin spacer 210 may be formed by forming a spacer layer on the dummy gate structures 190, the active fins 105, the first and second isolation patterns 120 and 130, and the first diffusion break pattern 140, and anisotropically etching the spacer layer. The spacer layer may be a nitride layer, e.g., a silicon nitride layer. The gate spacer 200 and the fin spacer 210 may be simply referred to as an insulation spacer.

After forming the gate spacer 200 and fin spacer 210, upper portions of the active fins 105 adjacent to (and not covered by) the dummy gate structure 190 may be etched to form recesses in the active fins 105 (referred to as fourth recesses herein), and source/drain regions (i.e., a source/drain of a transistor)220 may be formed on and fill the fourth recesses. For example, a source/drain region 220 may be grown in each of the fourth recesses. As shown in the exemplary cross section of FIG. 10, neighboring source/drain regions 220 may be grown to an extent to merge with each other, but they may also be grown to a lesser extent (or spaced further apart) to not merge with neighboring source/drains.

Specifically, each of the active fins 105 may be partially removed using the dummy gate structure 190 and the gate spacer 200 on the sidewall of the dummy gate structure 190 as an etching mask to form the fourth recesses. During the etching process, the fin spacer 210 may be partially or entirely removed. FIG. 10 illustrates that only the upper active pattern 105a of each of the active fins 105 is etched to form the fourth recesses, however, the inventive concept is not limited thereto. For example, not only the upper active pattern 105a, but also a portion of the lower active pattern 105b together with the upper active pattern 105a may be etched to form the fourth recess (e.g., the fourth recess may be formed lower than an upper surfaces of the first isolation pattern 120 and/or first diffusion break region 140).

A selective epitaxial growth (SEG) process may be performed using an upper surface of each of the active fins 105 in the fourth recesses as a seed to form the source/drain regions 220.

In example embodiments, the SEG process may be performed using a silicon source gas, e.g., disilane ($Si_2H_6$) gas and a carbon source gas, e.g., $SiH_3CH_3$, and thus a single crystalline silicon carbide (SiC) layer (e.g., monocrystalline SiC) may be formed as each source/drain region 220 on the first region I of the substrate 100. Alternatively, the SEG process may be performed using only a silicon source gas, e.g., disilane ($Si_2H_6$) gas, and thus a single crystalline silicon layer (i.e., monocrystalline Si) may be formed as each the source/drain region 220 on the first region I of the substrate 100. A single crystalline silicon carbide layer doped with n-type impurities or a single crystalline silicon layer doped with n-type impurities may be formed by additionally using an n-type impurity source gas, e.g., phosphine ($PH_3$) during the SEG process.

In example embodiments, the SEG process may be performed using a silicon source gas, e.g., dichlorosilane ($SiH_2Cl_2$) gas and a germanium source gas, e.g., germanium hydride ($GeH_4$), and thus a single crystalline silicon germanium (SiGe) layer (e.g., monocrystalline SiGe) may be formed as each source/drain region 220 on the second region II of the substrate 100. A single crystalline silicon germanium layer doped with p-type impurities may be formed by additionally using a p-type impurity source gas, e.g., diborane ($B_2H_6$) gas during the SEG process.

The source/drain regions 220 may grow vertically and horizontally to fill the fourth recesses and an upper portion of the source/drain regions 220 may contact a portion of an adjacent gate spacer 200. Each source/drain region 220 may have a shape of which a cross-section taken along the second direction may be similar to a pentagon or a hexagon, and when the distance between the neighboring active fins 105 is small, sidewalls of the source/drain regions 220 growing adjacent to each other may be connected to each other to form a single layer. FIG. 10 illustrates that two neighboring source/drain regions 220 grow on two neighboring active fins 105, respectively, and are combined to form one source/drain region 220.

After forming a first insulating interlayer 230 on the active fins 105, the first and second isolation patterns 120 and 130 and the first diffusion break pattern 140 to cover the dummy gate structure 190, the gate spacer 200, the fin spacer 210 and the source/drain regions 220, the first insulating interlayer 230 may be planarized until upper surfaces of the dummy gate electrodes 170 of the dummy gate structures 190 are exposed. During the planarization process, the dummy gate mask 180 may be also removed, and an upper portions of the gate spacers 200 may be also partially removed. The first insulating interlayer 230 may not completely fill a space between the combined source/drain region 220 and the first isolation pattern 120, and thus an air gap 235 may be formed. The first insulating interlayer 230 may be an oxide, e.g., silicon oxide.

The remainder of the dummy gate electrodes 170 and the dummy gate insulation pattern 160 thereunder may be removed, and a plurality of corresponding first openings 240 are formed, each exposing an inner sidewalls of the gate spacers 200, the upper surfaces of the active fins 105, and upper surfaces of the first and second isolation patterns 120 and 130. In addition, first openings 240 formed from etching of first dummy gate structures (inner first openings 240 in FIGS. 11 and 12) expose upper surface of the first diffusion break pattern 140. Gate structures 290 may be formed to fill a corresponding first opening 240.

Specifically, after performing a thermal oxidation process on the upper surfaces of the active fins 105 exposed by the first openings 240 to form an interface pattern 250 thereon, a gate insulation layer and a work function control layer may be sequentially formed on the interface pattern 250, the first and second isolation patterns 120 and 130, the first diffusion break pattern 140, the gate spacer 200 and the first insulating interlayer 230, and a gate electrode layer may be formed on the gate insulation layer to fill a remaining portion of the first opening 240.

The gate insulation layer, the work function control layer and the gate electrode layer may be formed by a CVD process or an ALD process. Similar to the gate insulation layer, the interface pattern 250 may be also formed by a CVD process, an ALD process, etc., instead of the thermal oxidation process, and in this case, the interface pattern 250 may be formed not only on the upper surface of the active fin 105, but also on the upper surfaces of the first and second isolation patterns 120 and 130, the upper surface of the first diffusion break pattern 140 and the inner sidewall of the gate spacer 200.

The gate electrode layer, the work function control layer and the gate insulation layer may be planarized until an upper surface of the first insulating interlayer 230 is exposed, and thus a gate insulation pattern 260 and a work function control pattern 270 are sequentially stacked on an upper surface of the interface pattern 250, the upper surfaces of the first and second isolation patterns 120 and 130, and (for first openings 240 resulting from first dummy gate structures) the upper surface of the first diffusion break pattern 140, and on the inner sidewalls of the gate spacers 200. A gate electrode 280 may be formed on the work function control pattern 270 to fill the remaining portion of the first opening 240. Accordingly, a lower surface and a sidewall of the gate electrode 280 may be sit within and contact the work function control pattern 270.

Thus, a gate structure 290 may be formed within each of the first openings 240, with each gate structure 290 formed from a sequential stack of the interface pattern 250, the gate insulation pattern 260, the work function control pattern 270 and the gate electrode 280 Each gate structure 290 may form NMOS and PMOS transistors on the first and second regions I and II of the substrate 100, respectively, together with the source/drain regions 220 and channel regions formed in the upper portions of the active fin regions 105 (e.g., channel regions formed in upper active patterns 105a located under a gate structure 290 and between two source drain regions 220).

The interface pattern 250 may be an oxide, e.g., silicon oxide, the gate insulation pattern 260 may be and/or include a metal oxide, e.g., hafnium oxide, tantalum oxide, zirconium oxide, etc., the work function control pattern 270 may be and/or include a metal nitride, e.g., titanium nitride, tantalum nitride, tungsten nitride, etc., and the gate electrode 280 may be and/or include a low resistance metal, e.g., aluminum, copper, titanium, tantalum, etc., a nitride thereof, or an alloy thereof.

Gate structures 290 formed by replacing the first dummy gate structures of the dummy gate structures 190 may be referred to as first gate structures.

Figure 12:
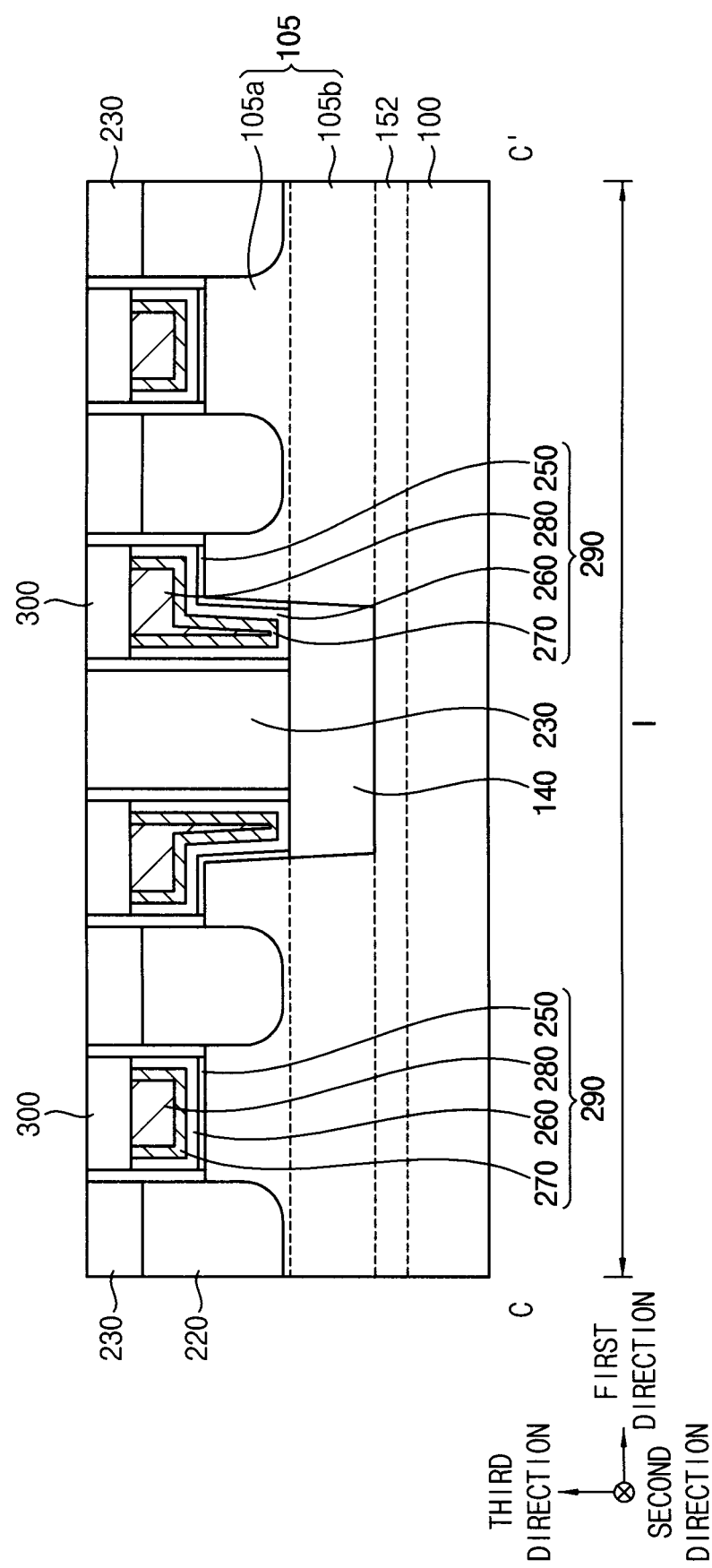

Referring to FIG. 12, an upper portion of each of the gate structures 290 may be removed to form fifth recesses, and a capping pattern 300 may be formed to fill the fifth recesses (e.g., via depositing an insulating film and planarizing the via CMP).

The capping pattern 300 may be a nitride, e.g., silicon nitride.

Figure 13:
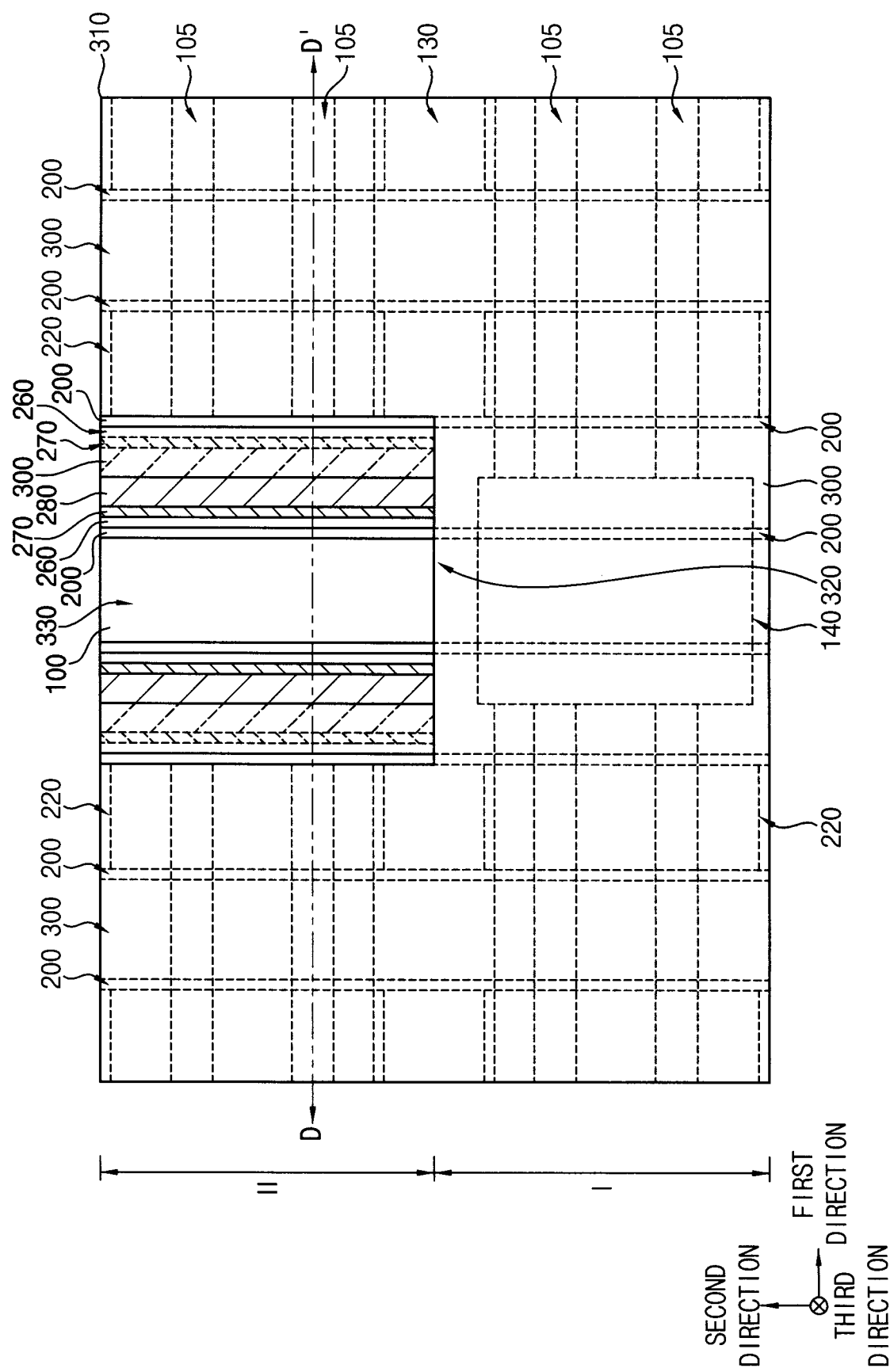
Figure 14:
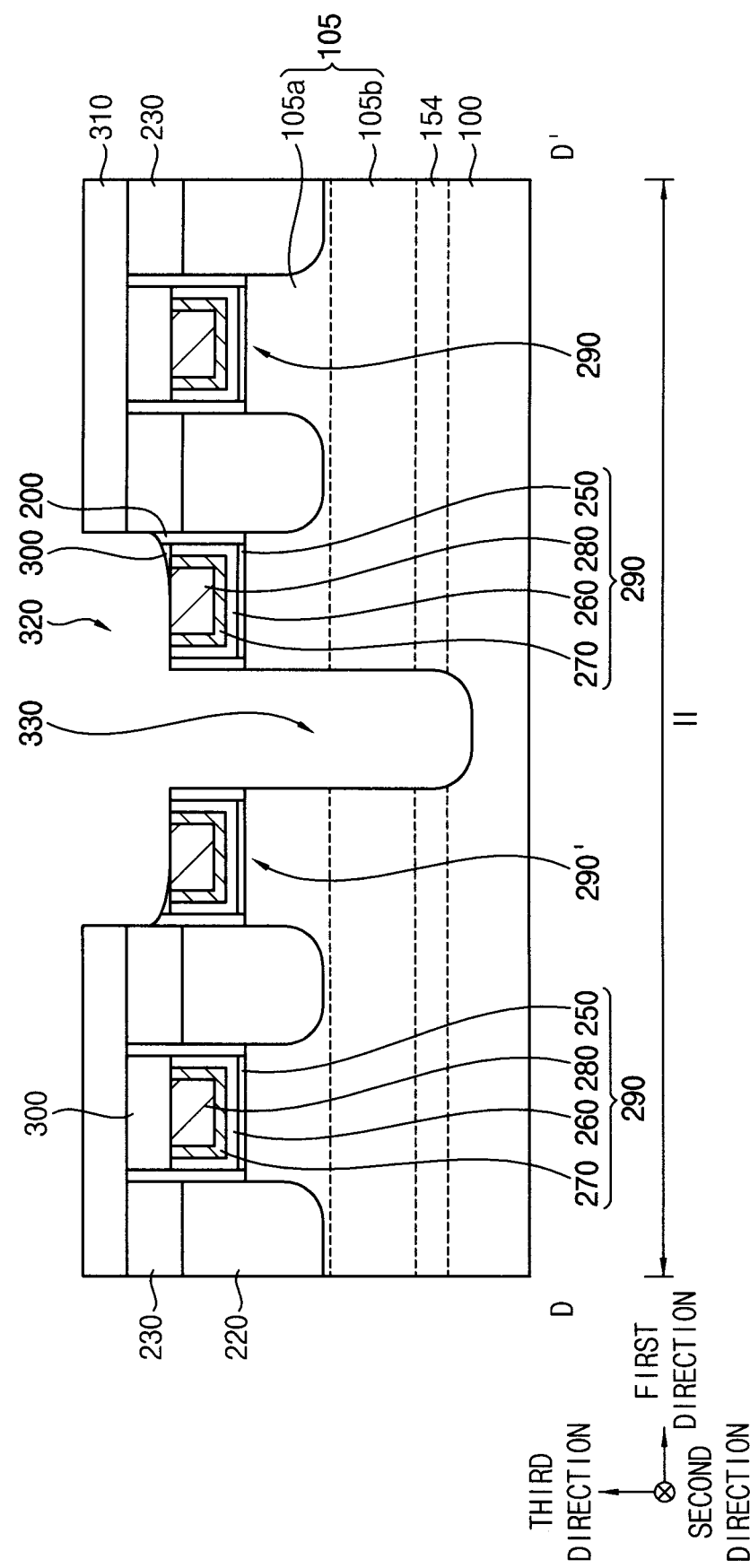

Referring to FIGS. 13 and 14, a fourth etching mask 310 having a second opening 320 is formed. The second opening may expose portions of the capping pattern 300, the gate spacers 200 and the first insulating interlayer 230. A first etching process using the fourth etching mask 310 may be performed until an upper surface of the first gate structures (inner gate structures 290 in FIG. 14) are exposed, resulting in the capping pattern 300, the gate spacers 200 and the first insulating interlayer 230 being etched. The fourth etching mask 310 may be an oxide, e.g., silicon oxide.

In example embodiments, the second opening 320 may overlap portions of the first gate structures (inner gate structures 290 in FIG. 4) on the second region II of the substrate 100 and portions of the first insulating interlayer 230 adjacent thereto. FIGS. 13 and 14 illustrate that the second opening 320 overlaps portions of two adjacent first gate structures on the second region II of the substrate 100. Prior to the first etching using the fourth etching mask 310, the second opening 320 also overlaps a portion of the first insulating interlayer 230 between these adjacent first gate structures. The second opening 320 also extends in the second direction to overlap two neighboring active fins 105 in the second regions II (the two neighboring second active fins) spaced apart from each other in the second direction.

By the first etching process, the second opening 320 may be transferred to the structure below it and expose portions of upper surfaces of first gate structures on the second region II of the substrate 100, and an upper surface of the source/drain region 220 therebetween may be also exposed.

The exposed source/drain region 220 and the active fin 105 thereunder may be etched by a second etching process using the fourth etching mask 310, and thus a third opening 330 exposing the upper surface of the substrate 100 and being connected with the second opening 320 may be formed. In example embodiments, the third opening 330 may be deeply formed to have a bottom lower than that of the active fins 105, and thus may divide second active fins e.g., divide each of the second active fins that the second opening 320 overlaps into two pieces that are aligned in the first direction. Also, the third opening 330 may extend in the second direction on the second region II of the substrate 100.

By the first and second etching processes, the portions of the capping pattern that the second opening 320 overlaps may be completely removed, or some of these portions may be left remaining on the upper surface of the first gate structures (inner gate structures 290 n FIG. 14). Also, since the all source/drain regions 220 between the first gate structures may be removed in some examples, each of the first gate structures may no longer serve as gates of any transistor. Accordingly, each of the first gate structures may be simply referred to as a conductive structure 290' in this instance. It should be apparent however, that the first gate structures may continue to function as gates of transistors formed elsewhere (e.g., for active fins formed outside of the regions illustrated in the figures) or for transistors formed in the first region I when the first diffusion break pattern 140 is formed in a different location in the first region I.

Figure 15:
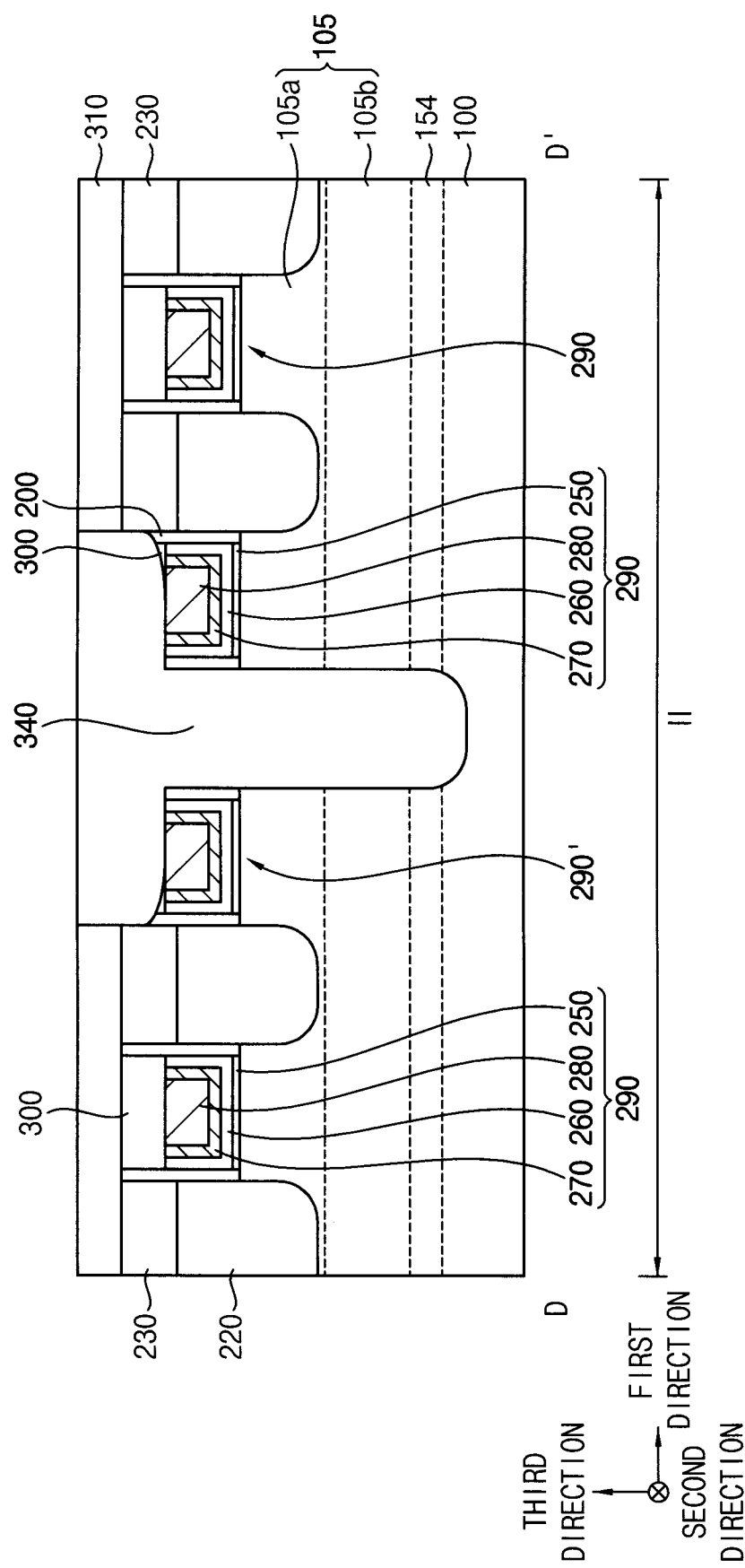
Figure 16:
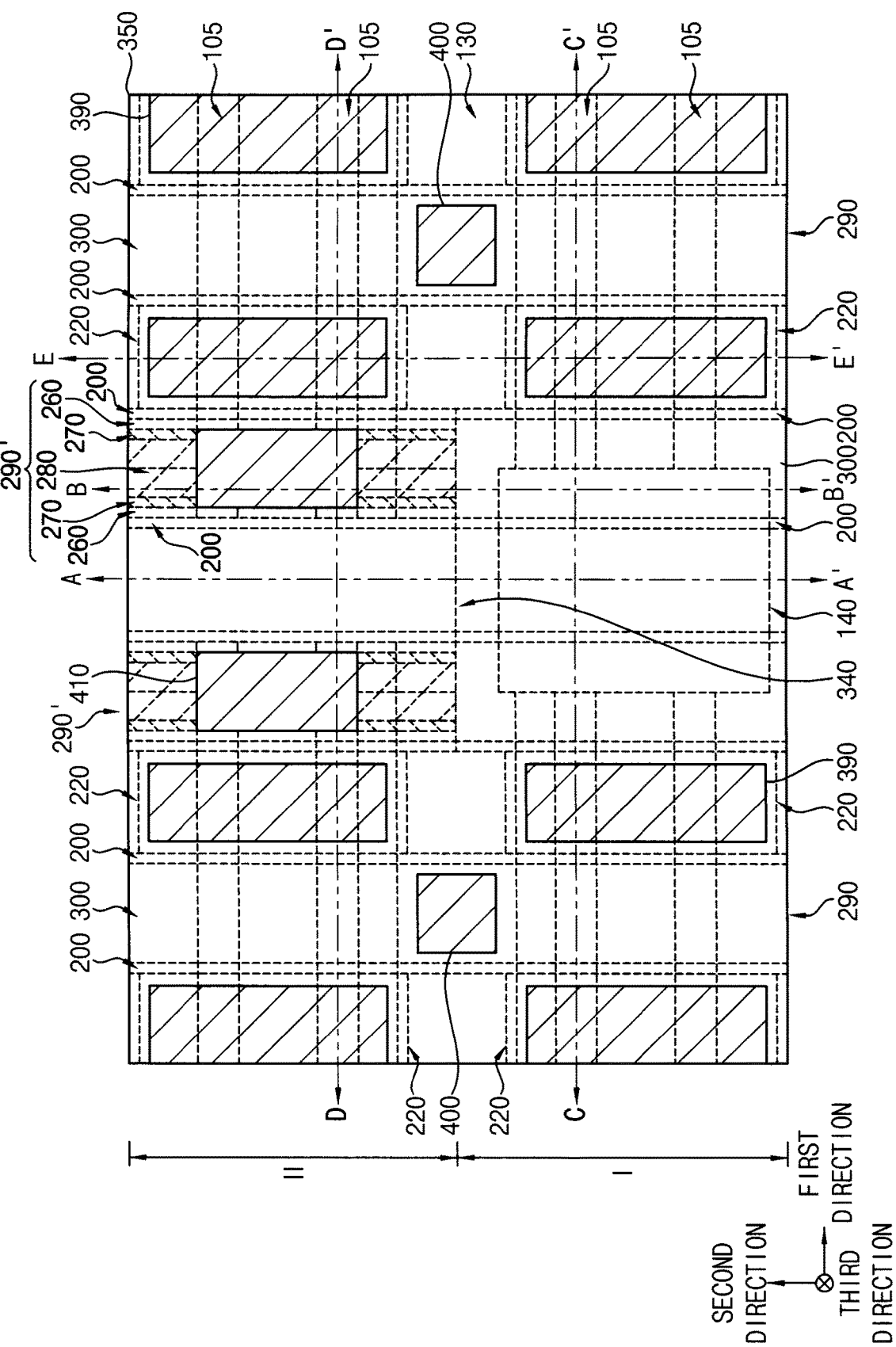
Figure 17:
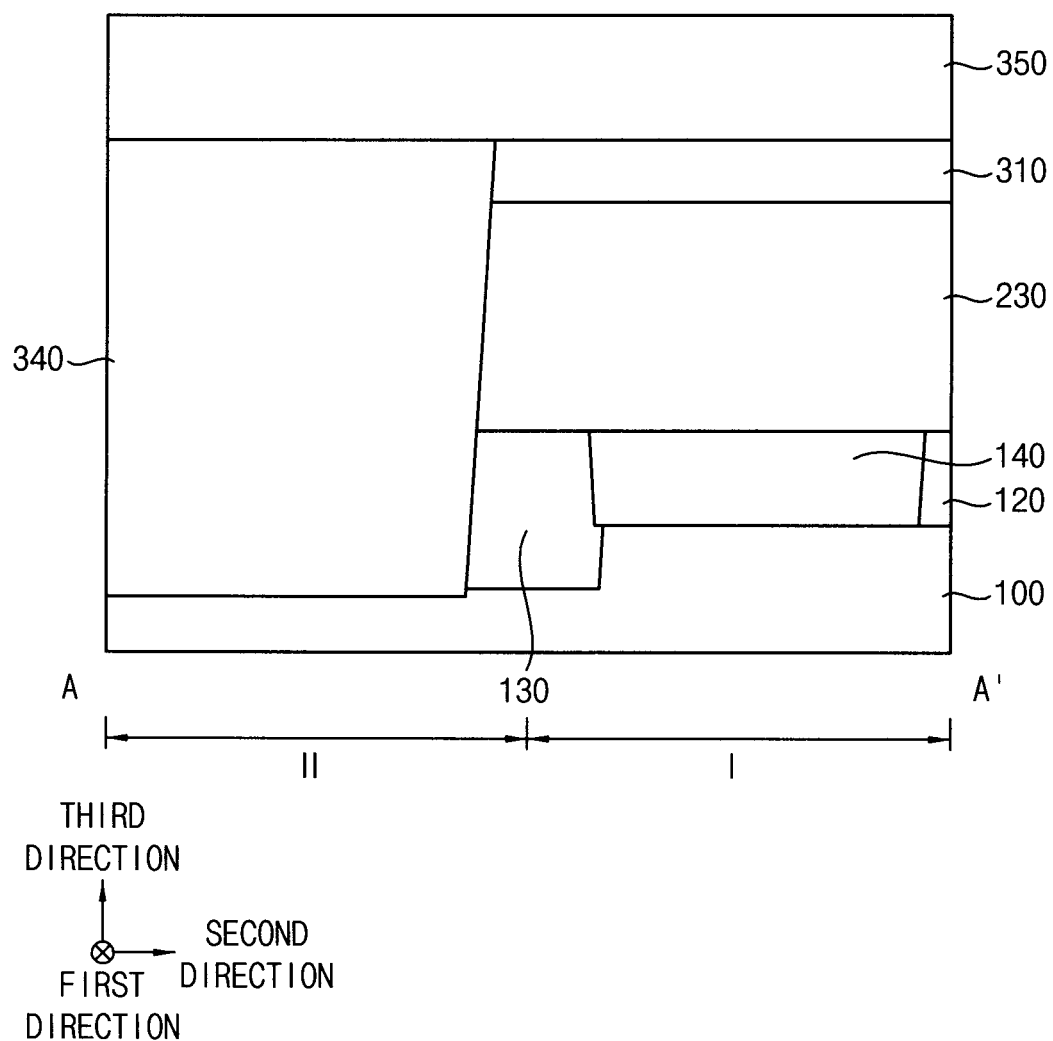

Referring to FIG. 15, a second diffusion break pattern 340 may be formed to fill the second and third openings 320 and 330.

The second diffusion break pattern 340 may include and/or be a nitride, e.g., silicon nitride. Corresponding to the shapes of the second and third openings 320 and 330, the second diffusion break pattern 340 may have a lower surface lower than the bottom of the second active fin, and may have an upper surface higher than the conductive structure 290'. The second diffusion break pattern 340 may fully cover (overlap) the conductive structure 290' within second opening 320. Depending on whether the capping pattern 300 remains or not, the second diffusion break pattern 340 may partially or entirely contact the upper surface of the conductive structure 290'.

Referring to FIGS. 16 to 19, 20A and 21, after forming a second insulating interlayer 350 on the fourth etching mask 310 and the second diffusion break pattern 340, a fourth openings 360 may be formed through the second insulating interlayer 350, the fourth etching mask 310 and the first insulating interlayer 230. Each fourth opening may expose an upper surface of a corresponding source/drain region 220. A metal silicide pattern 370 may be formed on each exposed upper surface of the source/drain region 220 exposed by a corresponding fourth opening 360. The second insulating interlayer 350 may include and/or be an oxide, e.g., silicon oxide.

The metal silicide pattern 370 may be formed by forming a metal layer on a lower surface and a sidewall of the fourth opening 360 and an upper surface of the second insulating interlayer 350, heat treating the metal layer to be reacted with the exposed source/drain region 220, and removing an un-reacted portion of the metal layer. The metal layer may include a metal, e.g., cobalt, nickel, titanium, etc., and thus the metal silicide pattern 370 may include e.g., cobalt silicide, nickel silicide, titanium silicide, etc.

For each of the gate structures 290, a fifth opening may be formed extending through the second insulating interlayer 350, the fourth etching mask 310 and the capping pattern 300 to expose the upper surface of the gate structure 290. For each of the conductive structures 290', a sixth opening 380 extending through the second insulating interlayer 350 and the second diffusion break pattern 340 to expose the upper surface of the conductive structure 290' may be formed.

A first contact plug 390, a second contact plug 40 and a third contact plug 410 may be formed to fill each fourth opening 360, each fifth opening and each sixth opening 380, respectively.

Each of the first to third contact plugs 390, 400 and 410 may comprise a conductive pattern (not shown) and a barrier pattern (not shown) covering a lower surface and a sidewall of the conductive pattern. For example, the conductive pattern may include a metal, and the barrier pattern may include a metal nitride.

Referring to FIGS. 20A and 20B, even after performing the first and second etching processes, the capping pattern 300 may remain on the upper surface of the conductive structure 290' and cover portions of the upper surface of the conductive structure 290'. FIG. 20A illustrates a portion of the capping pattern 300 remaining just on one edge of the upper surface of the conductive structure 290' (outer edges with respect to the cross section of FIG. 20A) while FIG. 20B illustrates that the capping pattern 300 completely covers the upper surface of the conductive structure 290' (within opening 320) except where contact plugs 410 are formed (each contact plug 410 penetrating capping pattern 300 through a hole formed therethrough so capping pattern 300 surrounds each contact plug 410). As shown in FIG. 20B (see also FIG. 16), for each of the conductive structures 290', the capping pattern 300 extends from one edge of the conductive pattern 290' to the other edge of the conductive structure 290'.

Upper wirings (not shown) connected to the first to third contact plugs 390, 400 and 410 may be further formed to complete the fabrication of the semiconductor device.

The semiconductor device manufactured by the above-described processes may include active fins 105, the first and second diffusion break patterns 140 and 340, the gate structures 290 and the conductive structures 290' on the substrate 100 including the first and second regions I and II.

The active fins 105 may extend in the first direction, and may include a plurality of first active fins and a plurality of second active fins on the first and second regions I and II, respectively, of the substrate 100. The gate structure 290 may extend in the second direction on the active fins 105 on the first and second regions I and II of the substrate 100, and a plurality of gate structures 290 may be formed to be spaced apart from each other along the first direction.

The first diffusion break pattern 140 may be formed on the first region I of the substrate 100, and may divide each of the first active fins into a plurality of pieces, e.g., two pieces aligned in the first direction. The conductive structures 290' may extend in the second direction over the first active fins on the first region I of the substrate 100 and over the second active fins on the second region II of the substrate 100. The second diffusion break pattern 340 may be formed on the second region II of the substrate 100 to divide each of the second active fins into a plurality of pieces, e.g., two pieces aligned in the first direction, and may be formed over and may contact portions of the conductive structures 290' on the second region II of the substrate 100 in the first direction.

In example embodiments, the second diffusion break pattern 340 may have a lower surface lower than bottom of the second active fin, and may have an upper surface higher than that of the conductive structures 290'. In example embodiments, each of the conductive structures 290' may contact a top surface of the first diffusion break pattern 140 at an edge of the first diffusion break pattern 140 and each of the conductive structures 290' may contact a portion of the upper surface of a corresponding first active fin adjacent to a corresponding edge of the first diffusion break pattern 140. A plurality of conductive structures 290' may be formed to be spaced apart from each other along the first direction. The first diffusion break pattern 140 may contact lower surfaces of the plurality of conductive structures 290'.

In example embodiments, the upper surface of the first diffusion break pattern 140 may be lower than bottom of the active fins 105. Accordingly, each conductive structure 290' contacting the upper surface of the first active fin and the upper surface of the first diffusion break pattern 140 on the first region I of the substrate 100 may have a staircase shape and the full extent of its lower surface may not be flat.

In example embodiments, with respect to some vertical cross sections, each conductive structure 290' may have a shape and a structure substantially the same as those of the gate structures 290, and a distance between the gate structures 290 may be substantially the same as a distance between the conductive structure 290' and the gate structure 290 adjacent thereto. As with the gate structures 290, insulation spacers 200 may be formed on sidewalls of each conductive structure 290', and at least a portion of an upper surface of each insulation spacer 200 may be covered by the capping pattern 300.

Unlike the gate structure 290, the conductive structure 290' may not serve as a gate of a transistor, but may serve as a routing wiring through which a voltage may be applied via the third contact plug 410 thereon.

In the semiconductor device, one or more of the active fins 105 may be divided in the first direction by the first diffusion break pattern 140, which may be an oxide, on the first region I of the substrate 100 (serving as an NMOS region). One or more other active fins 105 may be divided in the first direction by the second diffusion break pattern 340, which may be a nitride, on the second region II of the substrate 100 serving as a PMOS region. Accordingly, different types of stresses and/or different magnitudes of stresses may be applied by the different diffusion break patterns (140, 340) to different sets of active fins 105 (and more specifically, to channel regions formed therein). For example, a tensile stress may be applied to channel regions (formed by portions of active fins 105 under gate structures 290) of NMOS transistors formed in the first region I by the first diffusion break pattern 140, while a compressive stress may be applied to channel regions (formed by portions of active fins 105 under gate structures 290) of PMOS transistors formed in the second region II by the second diffusion break pattern 340. Thus, the electrical performance of the channel regions may be improved.

Figure 22:
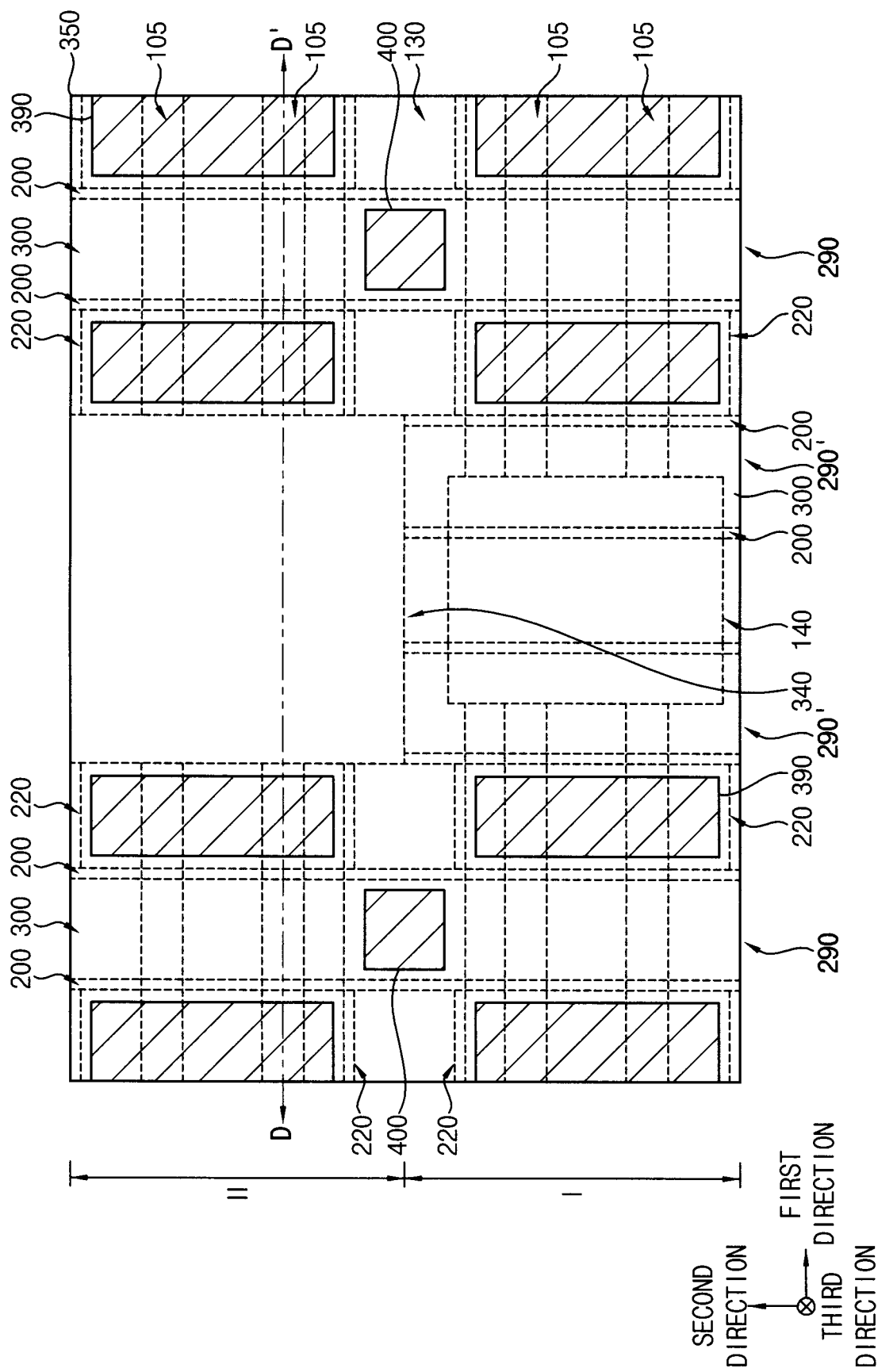
FIGS. 22 and 23 are a plan view and a cross-sectional view illustrating a method of manufacturing a semiconductor device in accordance with example embodiments.
Figure 23:
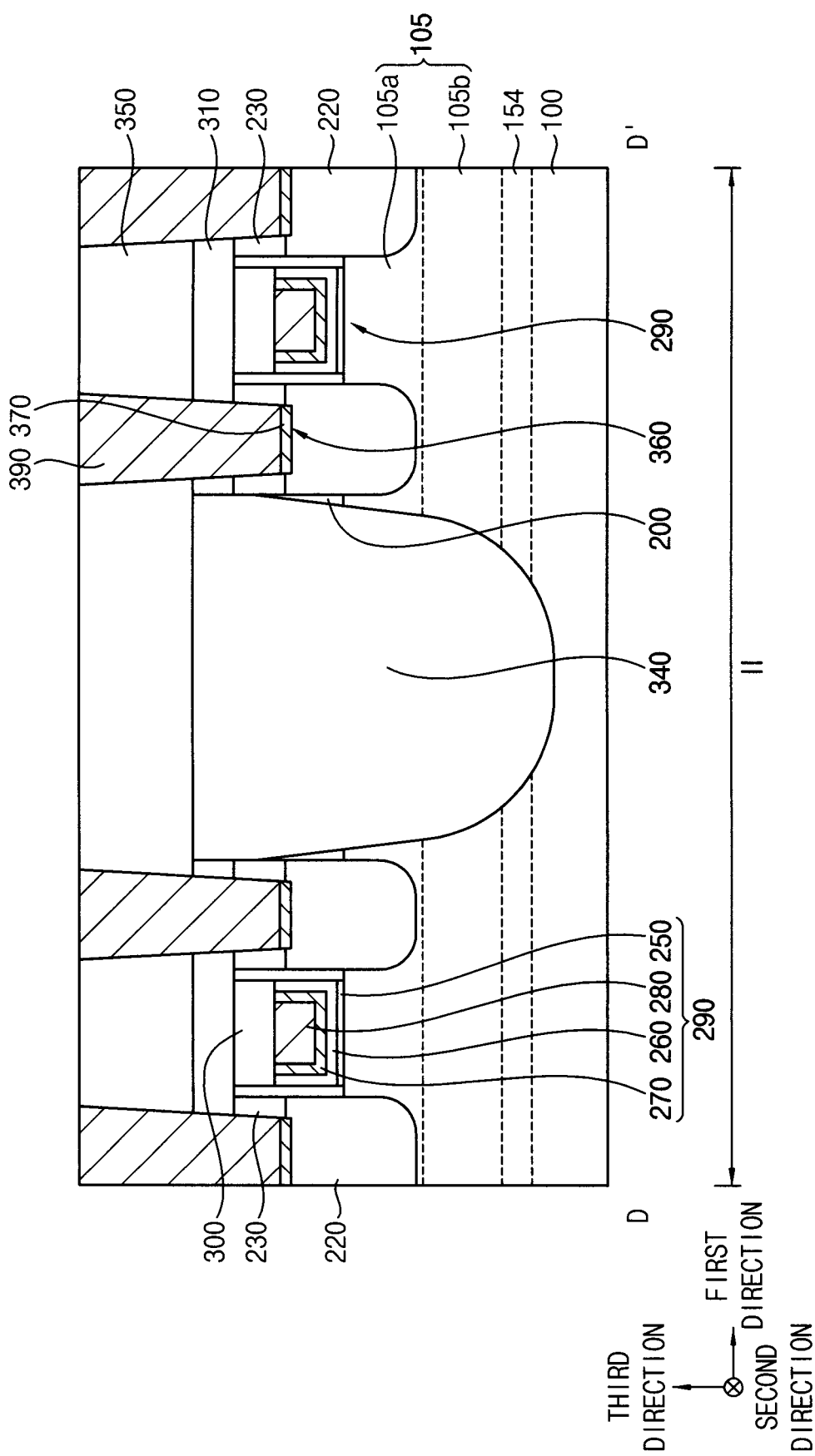

Referring to FIGS. 22 and 23 are a plan view and a cross-sectional view illustrating a method of manufacturing a semiconductor device in accordance with example embodiments. Specifically, FIG. 22 is the plan view, and FIG. 23 and a cross-sectional view taken along a line D-D' of FIG. 22.

This method of manufacturing the semiconductor device includes processes which may be the same as or similar to the processes described in FIGS. 1 to 21, and thus duplicative descriptions may be omitted herein.

For example, processes the same as the processes described in FIGS. 1 to 14 may be performed.

However, with respect to the first etching process described in connection with FIG. 14, after performing the first etching process to form the second opening 320, a portion of the conductive structure 290' exposed by the second opening 320 may be etched before performing the second etching process. That is, the first etching process may be performed until the conductive structure 290' may be entirely removed.

Accordingly, after performing the second etching process, the portions of the conductive structures 290' exposed by the second opening 320 and the capping pattern 300 covering these portions of the conductive structures 290' may be entirely removed, and a seventh opening (corresponding to the second diffusion break pattern 340 shown in FIG. 23) exposing the upper surface of the substrate 100 may be formed.

After forming the seventh opening, processes substantially the same as or similar to the processes described in FIGS. 15 to 21 may be performed to complete the fabrication of the semiconductor device.

Unlike the semiconductor device described in FIGS. 16 to 21, in the semiconductor device described in FIGS. 22 and 23, the conductive structures 290' may not remain on the second region II of the substrate 100. Accordingly, the second diffusion break pattern 340 may not be formed between portions of the conductive structures 290' on the second region II of the substrate 100, but may contact an end of each of the conductive structures 290' on the first region I of the substrate 100 in the second direction.

In example embodiments, the second diffusion break pattern 340 may have a lower surface lower than that of the second active fin, and may have an upper surface higher than that of the conductive structure 290'. Also, the maximum width of the second diffusion break pattern 340 in the first direction may be greater than the maximum width of the first diffusion break pattern 140 in the first direction.

Figure 24:
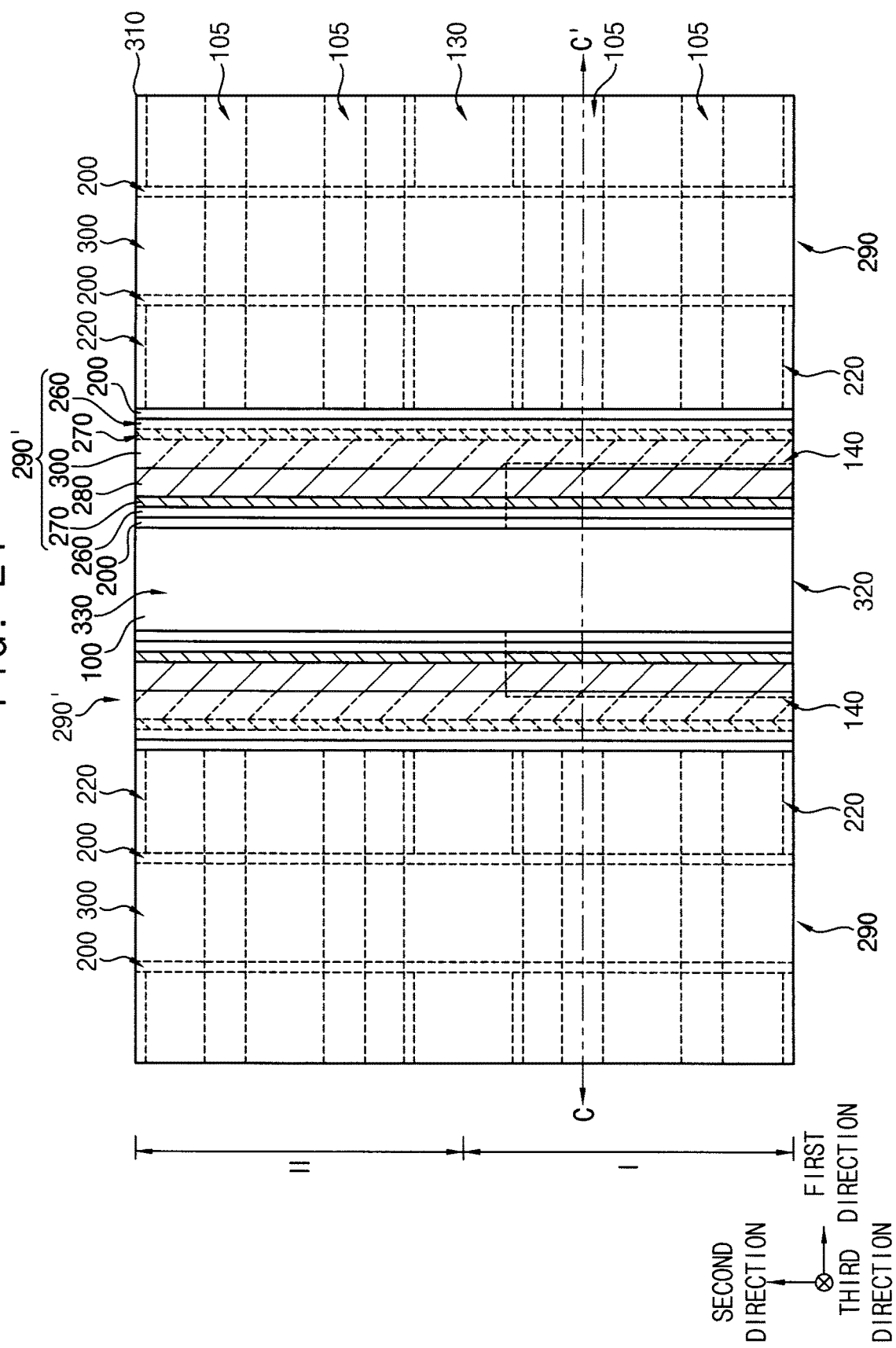
FIGS. 24 to 27 are plan views and cross-sectional views illustrating a method of manufacturing a semiconductor device in accordance with example embodiments.
Figure 27:
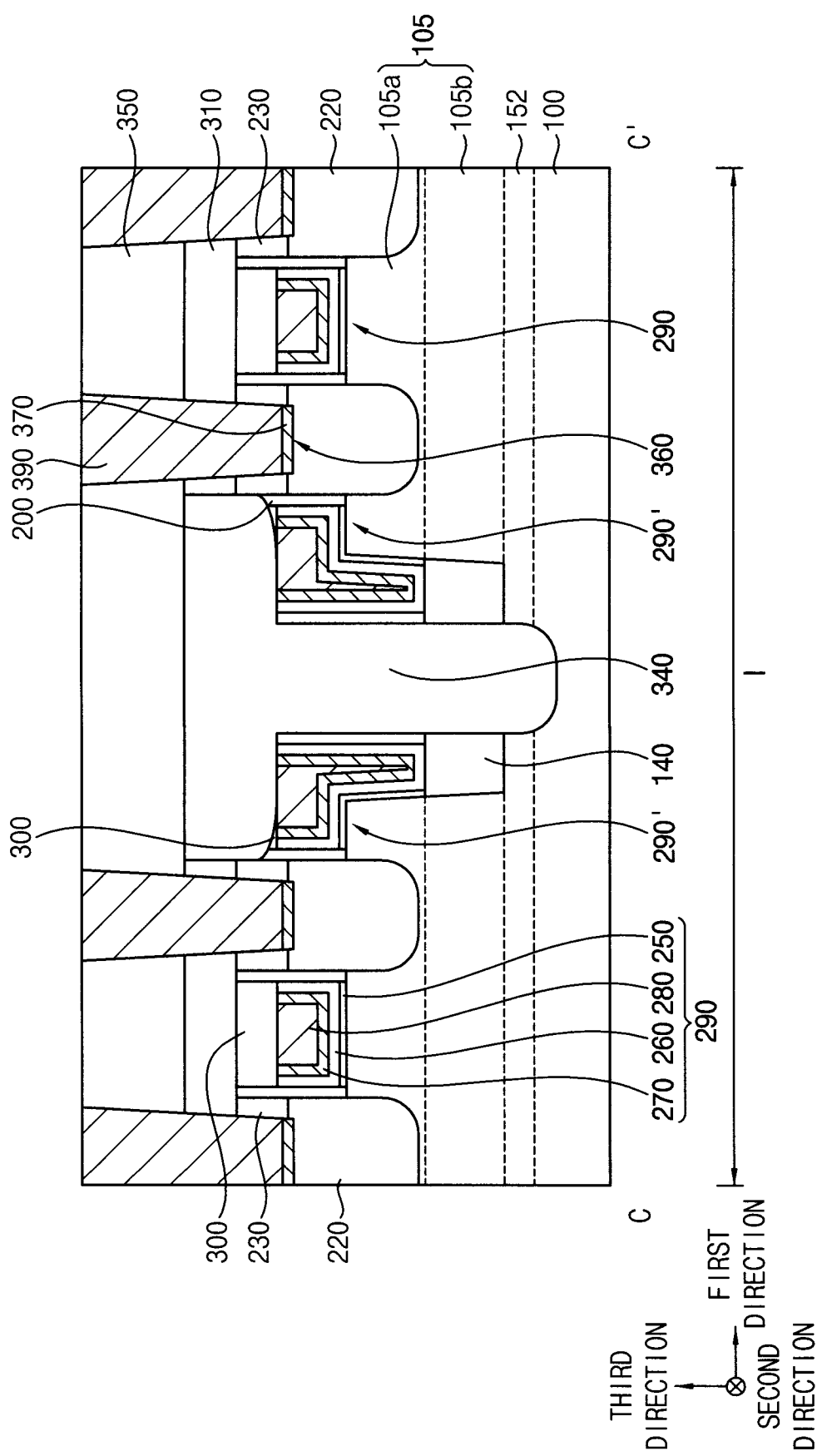

FIGS. 24 to 27 are plan views and cross-sectional views illustrating a method of manufacturing a semiconductor device in accordance with example embodiments. Specifically, FIGS. 24 and 26 are the plan views, and FIGS. 25 and 27 are cross-sectional views taken along lines C-C' of FIGS. 25 and 27, respectively.

This method of manufacturing the semiconductor device includes processes the same as or similar to the processes described in FIGS. 1 to 21, and thus duplicative detailed descriptions may be omitted herein.

Referring to FIGS. 24 and 25, processes the same as or similar to the processes described in FIGS. 1 to 14 may be performed.

However, with respect to the first etching process described in connection with FIG. 14, the second opening 320 may be formed in both the first region I and the second region II. As shown in FIG. 24 and the cross section of FIG. 25 (in the first region), the second opening 320 may expose first gate structures 290' at locations over both the first region I and the section region II of the substrate 100. Accordingly, by the first etching process, portions of the first gate structure on the first and second regions I and II of the substrate 100 may be exposed, and the third opening 330 formed by the second etching process may divide each of the first and second active fins in into a plurality of pieces, e.g., two pieces in the first direction. The third opening 330 may extend in the second direction on the first and second regions I and II of the substrate 100.

Referring to FIGS. 26 and 27, processes substantially the same as or similar to the processes described in FIGS. 15 to 21 may be performed to complete the fabrication of the semiconductor device. Cross sections A-A', D-D' and E-E' of FIG. 26 may have the same structure as those of FIGS. 17, 20A (or 20B) and 21, respectively.

Unlike the semiconductor described in FIGS. 16 to 21, in the semiconductor described in FIGS. 26 and 27, the second diffusion break pattern 340 may be formed on the first and second regions I and II of the substrate 100 to divide each of the first and second active fins into a plurality of pieces, e.g., two pieces aligned in the first direction, respectively, and may be formed between the conductive structures 290'.

In example embodiments, the second diffusion break pattern 340 may extend through and contact the first diffusion break pattern 140 on the first region I of the substrate 100, and a lower surface of the second diffusion break pattern 340 may be lower than a lower surface of the first diffusion break pattern 140.

Figure 28:
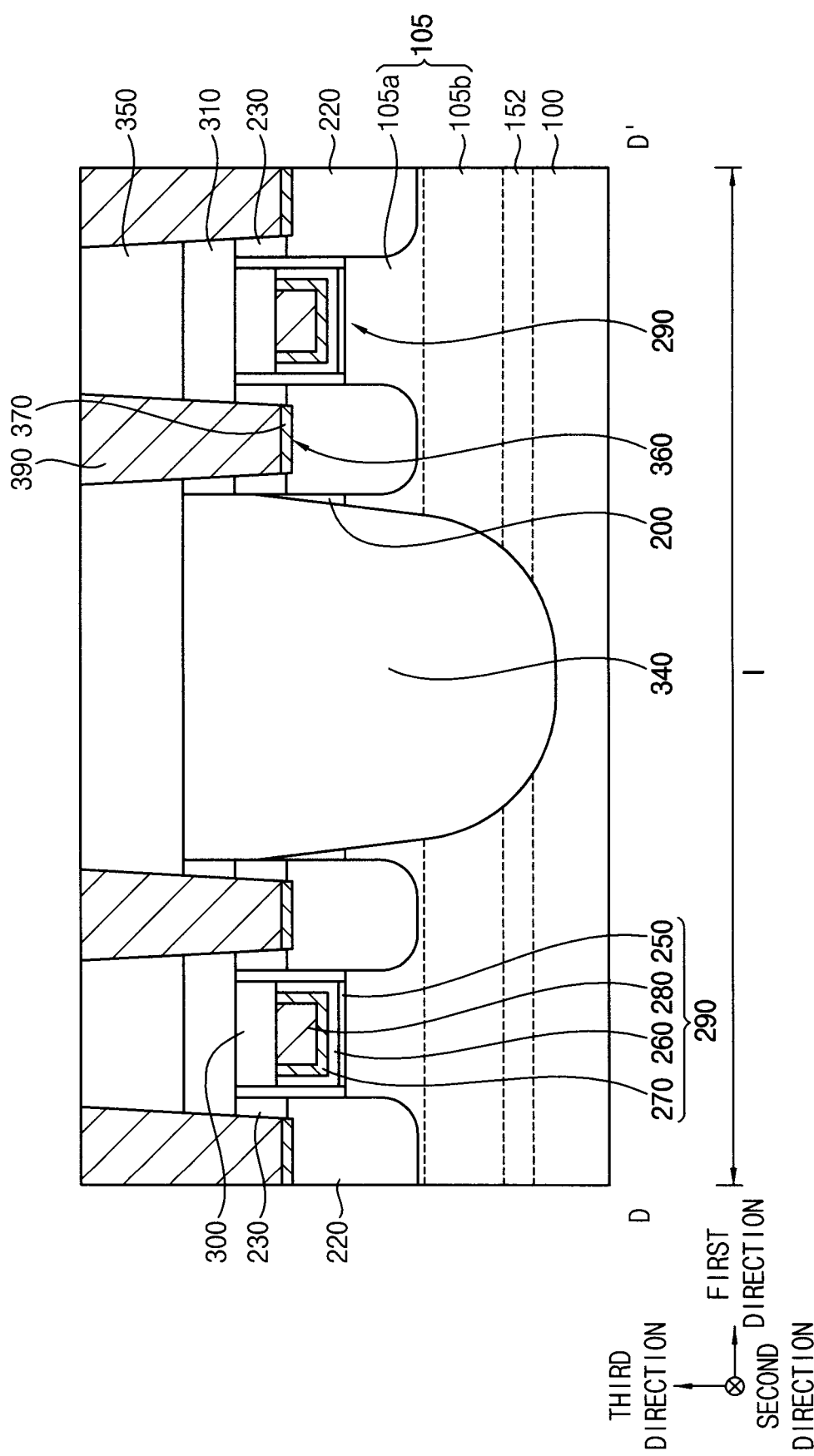
FIG. 28 is a cross-sectional view illustrating a semiconductor device in accordance with example embodiments.

FIG. 28 is a cross-sectional view illustrating a semiconductor device in accordance with example embodiments. FIG. 28 shows an alternative to the embodiment described with respect to FIGS. 24 to 27. Specifically, FIG. 28 is a cross-sectional view taken along a line C-C' of FIG. 26. In this alternative, cross sections A-A', D-D' and E-E' of FIG. 26 may have the same structure as those of FIGS. 17, 23 and 21, respectively.

This semiconductor device may be the same as or similar to the semiconductor device described in FIGS. 26 and 27, except for the shapes of the second diffusion break pattern and the conductive structure 290', and thus detailed descriptions thereof are omitted herein.

Referring to FIG. 28, similar to the second diffusion break pattern 340 of the semiconductor device described in FIGS. 22 and 23, the second diffusion break pattern 340 may not be formed between the conductive structures 290'.

Specifically, during an etching process for forming the second diffusion break pattern 340, the capping pattern 300 covering the conductive structure 290' and the upper surface thereof may be entirely removed, and this may correspond not only to the second region II of the substrate 100, but also to the first region I of the substrate 100. Accordingly, in the semiconductor device, no conductive structure 290', corresponding to the gate structure 290 may remain. Further, during the etching process for forming the second diffusion break pattern 340, the first diffusion break pattern 140 on the first region I of the substrate 100 (or at least portions thereof) may be also removed.

Accordingly, the semiconductor device may have only the second diffusion break pattern 340 extending in the second direction on the first and second regions I and II of the substrate 100.

FIGS. 29 to 33 are plan views and cross-sectional views illustrating a method of manufacturing a semiconductor device in accordance with example embodiments.

Figure 29:
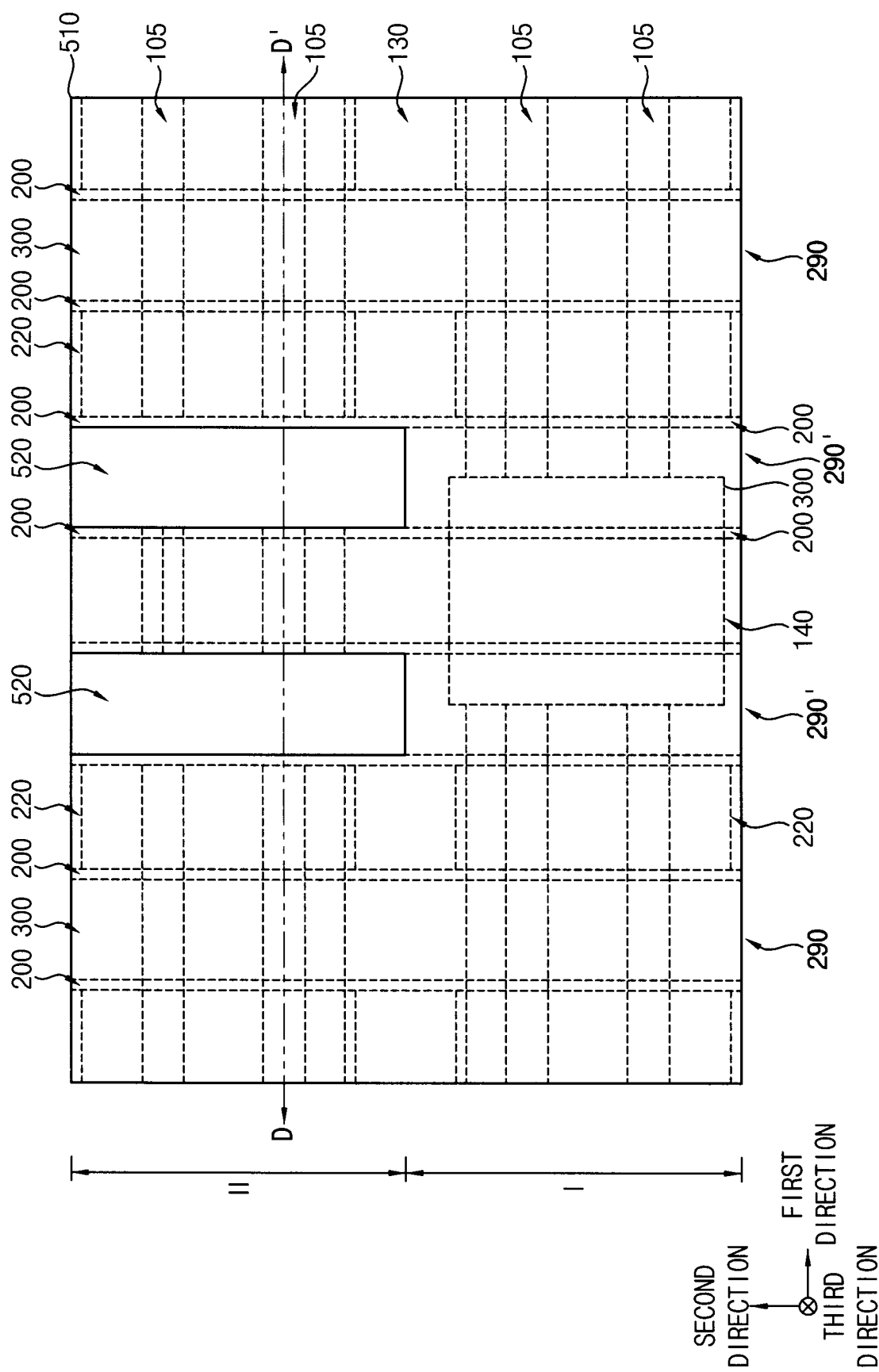
FIGS. 29 to 33 are plan views and cross-sectional views illustrating a method of manufacturing a semiconductor device in accordance with example embodiments.
Figure 30:
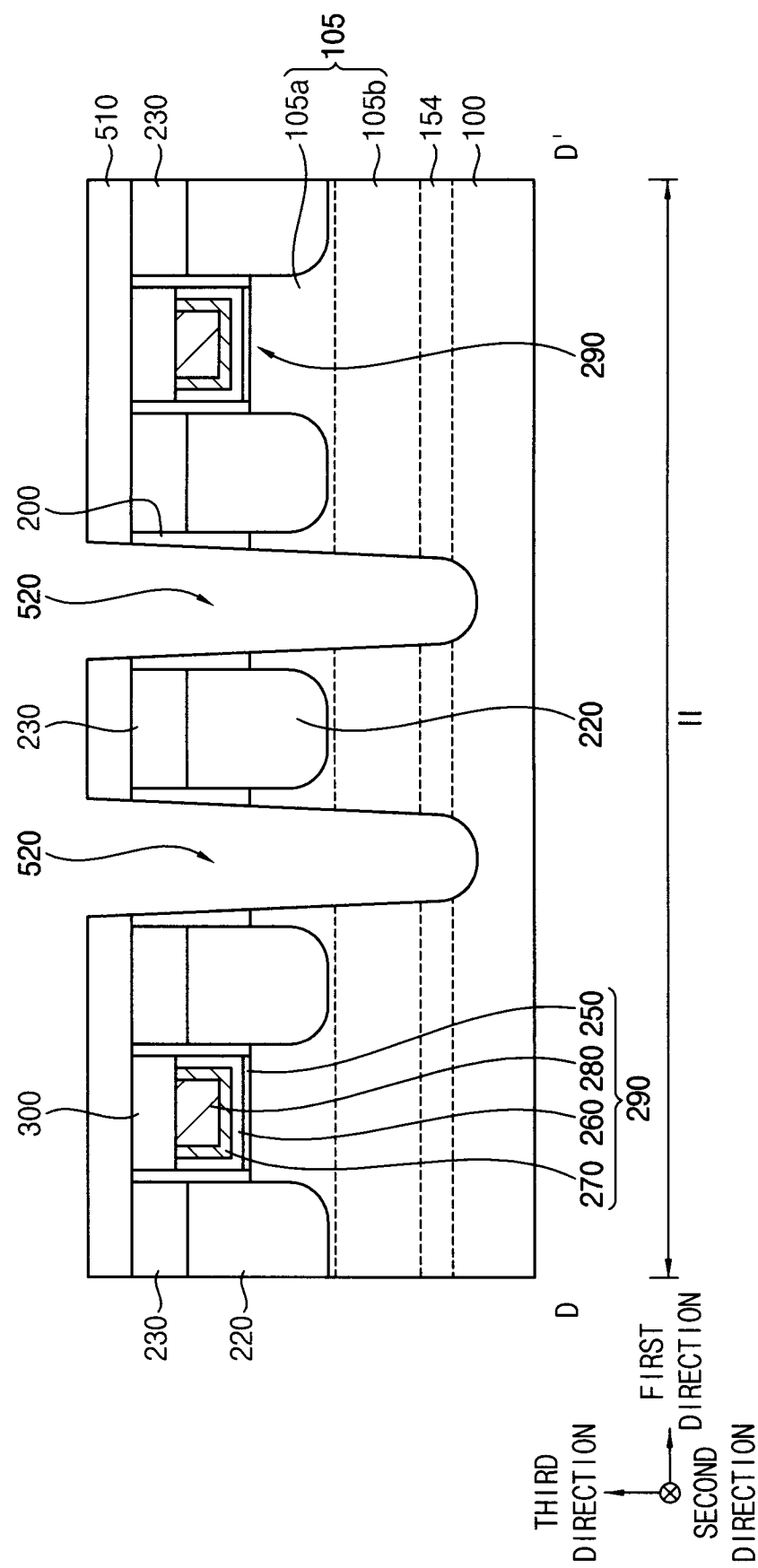
Figure 31:
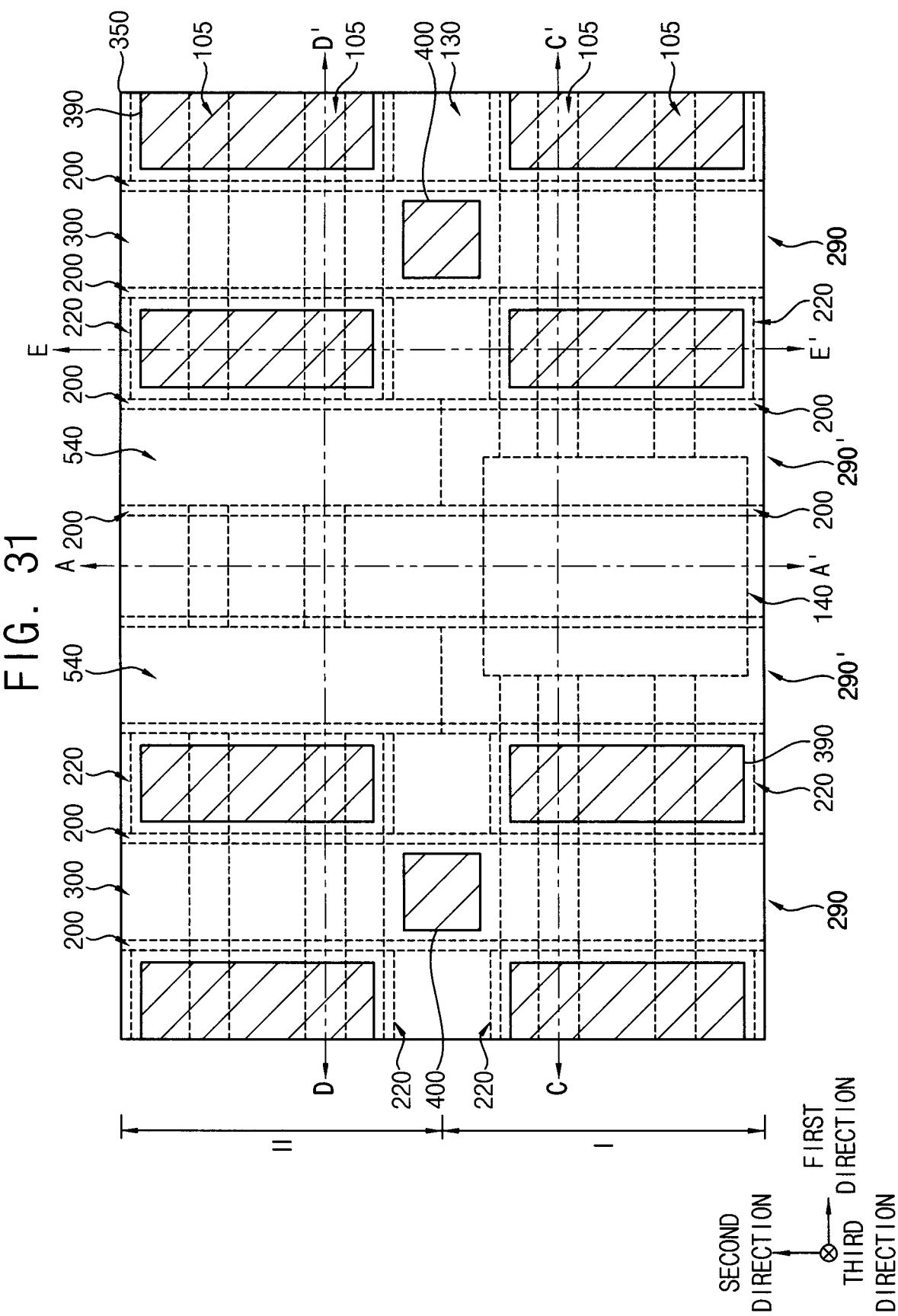
Figure 32:
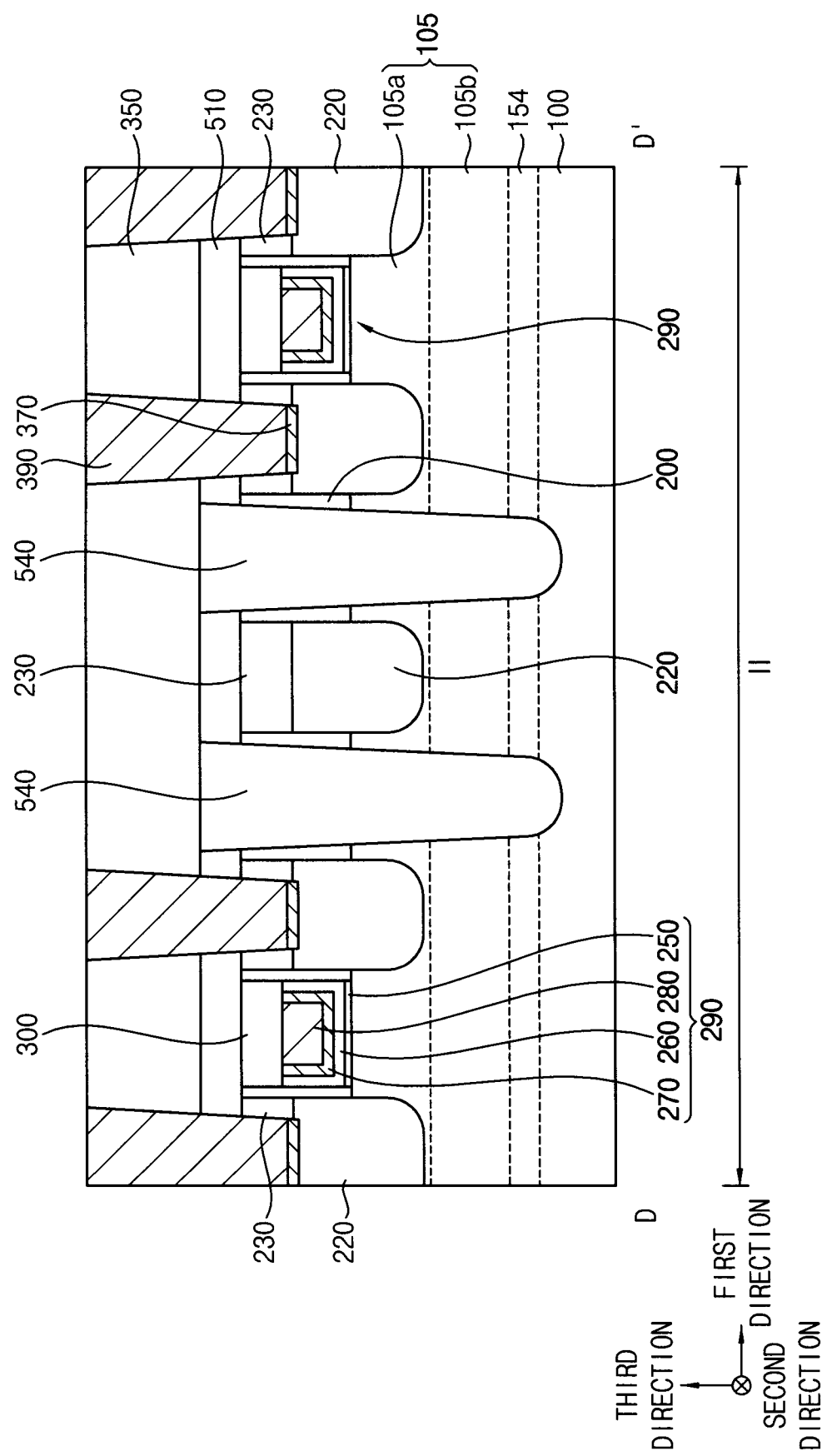
Figure 33:
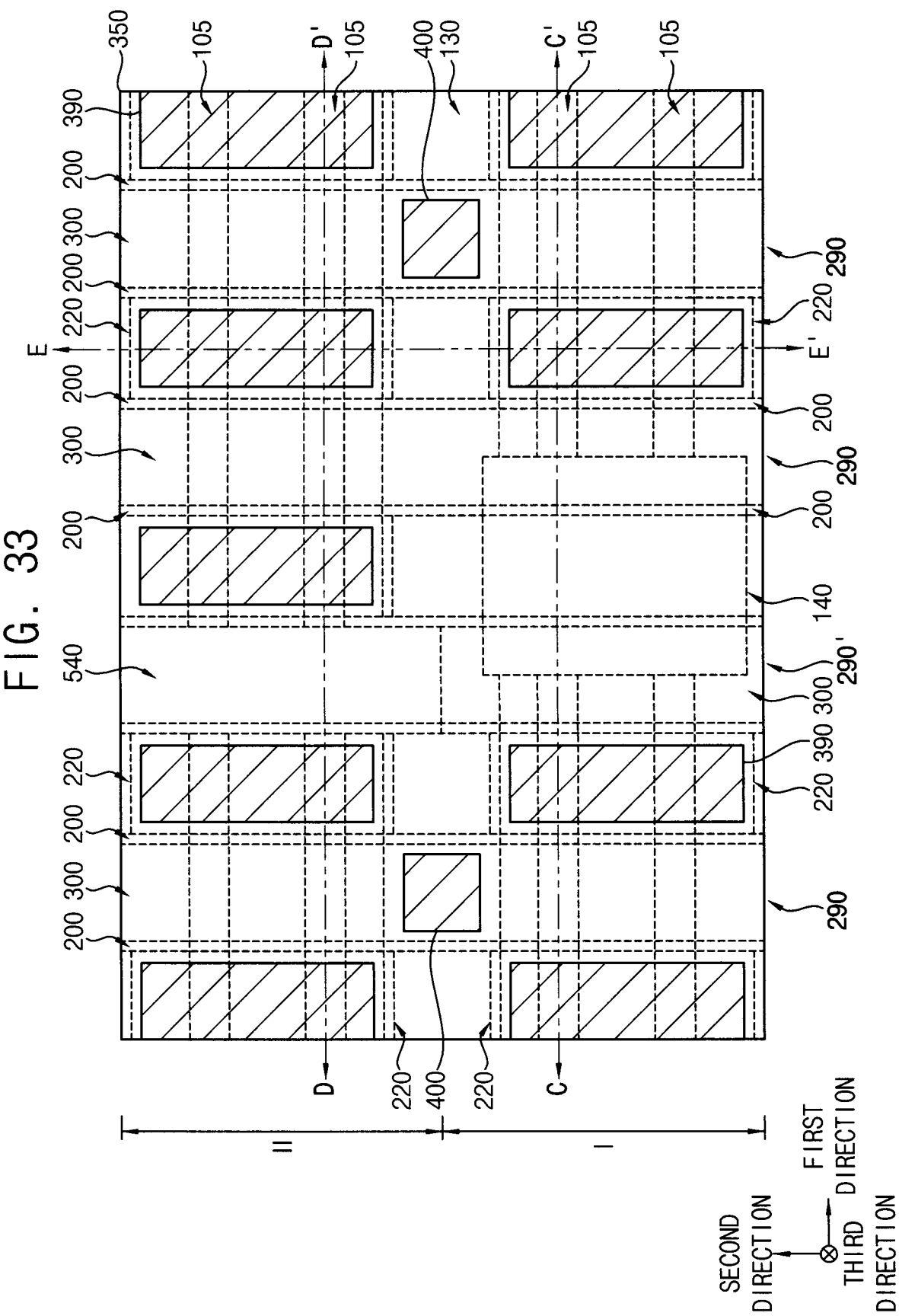

Specifically, FIGS. 29, 31 and 33 are the plan views, and FIGS. 30 and 32 are cross-sectional views taken along lines DD' of FIGS. 29 and 31, respectively. Cross section D-D' may be the same as that of FIG. 32, except one of the diffusion break regions 540 (right one in FIG. 32) may not be formed and a gate structure 290 may be formed there (not removed) instead. Cross sections A-A', C-C' and E-E' of FIGS. 31 and 33 may be the same as that of FIGS. 17, 19 and 21, respectively.

This method of manufacturing the semiconductor device includes processes the same as or similar to the processes described in FIGS. 1 to 21, and thus duplicative detailed descriptions may be omitted herein.

Referring to FIGS. 29 and 30, processes the same as or similar to the processes described in FIGS. 1 to 14 may be performed.

However, instead of the fourth etching mask 310 having a continuous second opening 320 which overlaps plural the first gate structures and the portion of the first insulating interlayer 230 therebetween on the second region II of the substrate 100, a fifth etching mask 510 having eighth openings 520, each overlapping only a corresponding one of the first gate structures in the third direction may be used in the etching process. Thus, the portion of the first gate structure and the portion of the second active fin thereunder on the second region II of the substrate 100 may be removed, transferring each of the eighth openings 520 downwardly. Each eighth opening 520 may have a lower surface lower than that of the second active fin, and thus the second active fin may be separated in the first direction.

In example embodiments, two first gate structures neighboring to each other in the first direction on the second region II of the substrate 100 may be removed by the etching process, and thus each second active fin may be divided into three portions in the first direction.

Referring to FIGS. 31 and 32, processes the same as or similar to the processes described in FIGS. 15 to 21 may be performed to complete the fabrication of the semiconductor device.

Instead of the second diffusion break pattern 340 formed to fill the second and third openings 320 and 330, a third diffusion break pattern 450 may be formed to fill each of the eighth openings 520. In example embodiments, each third diffusion break pattern 540 may extend in the second direction on the second region II of the substrate 100, and a plurality of third diffusion break patterns 540, e.g., two third diffusion break patterns 540 may be formed side by side in the first direction. The source/drain regions 220 may remain between the third diffusion break patterns 540, but may not serve as a source/drain of a transistor.

Each of the third diffusion break patterns 540 may have a lower surface lower than the second active fin to divide the second active fins into a plurality of pieces, e.g., three pieces or more aligned in the first direction, and may have an upper surface higher than the upper surface of the gate structures 290 remaining on the second region II of the substrate 100. Each of the third diffusion break patterns 540 may align with a corresponding conductive structure 290' on the first region I in the second direction (and contact the same).

Referring to FIG. 33, the third diffusion break pattern 540 may be also formed by partially removing only any one of the neighboring first gate structures. Accordingly, the first gate structure not removed may serve as a gate of a transistor, and a remaining portion of the first gate structure partially removed may be simply referred to as the conductive structure 290'.

In the semiconductor device, the active fin 105 may be divided in the first direction by the first diffusion break pattern 140, which may be an oxide, on the first region I of the substrate 100 used as an NMOS region, the active fin 105 may be divided in the first direction by the third diffusion break pattern 540, which may be a nitride, on the second region II of the substrate 100 used as a PMOS region. Accordingly, a tensile stress and a compression stress may be applied to channel regions of NMOS transistors and PMOS transistors, respectively, and the electrical performance of the channel regions may be improved.

The above semiconductor device may be applied to various types of memory devices and systems including finFETs. For example, the semiconductor may be applied to logic devices such as central processing units (CPUs), main processing units (MPUs), or application processors (APs), or the like, including finFETs. Additionally, the semiconductor device may be applied to volatile memory devices such as DRAM devices or SRAM devices, or the like, or non-volatile memory devices such as flash memory devices, PRAM devices, MRAM devices, RRAM devices, or the like, including finFETs.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A semiconductor device, comprising:
    a substrate provided with active fins, each of the active fins extending in a first direction, the active fins being spaced apart from each other in a second direction;
    a conductive structure extending in the second direction on the substrate, the conductive structure contacting the active fins;
    a first diffusion break pattern between the substrate and the conductive structure, the first diffusion break pattern dividing a first active fin of the active fins into a plurality of pieces aligned in the first direction; and
    a second diffusion break pattern adjacent to the conductive structure on the substrate, the second diffusion break pattern having an upper surface higher than a lower surface of the conductive structure, and dividing a second active fin of the active fins into a plurality of pieces aligned in the first direction,
    wherein the second diffusion break pattern is not formed directly underneath the conductive structure.

2. The semiconductor device of claim 1, wherein the upper surface of the second diffusion break pattern is higher than an upper surface of the conductive structure.

3. The semiconductor device of claim 2, wherein the second diffusion break pattern covers a portion of the upper surface of the conductive structure.

4. The semiconductor device of claim 1, wherein a lower surface of the second diffusion break pattern is lower than a bottom of the second active fin.

5. The semiconductor device of claim 1,
    wherein the active fins include a plurality of second active fins arranged side by side in the second direction, and
    wherein the second diffusion break pattern extends in the second direction to divide each of the plurality of second active fins into a plurality of pieces aligned in the first direction.

6. The semiconductor device of claim 1, wherein the conductive structure includes a plurality of conductive structures arranged side by side in the first direction, and the first diffusion break pattern is formed under the plurality of conductive structures.

7. The semiconductor device of claim 6, wherein the second diffusion break pattern includes a portion formed between the conductive structures.

8. The semiconductor device of claim 7, wherein the second diffusion break pattern extends over a portion of an upper surface of each of the conductive structures.

9. The semiconductor device of claim 1, wherein an upper surface of the first diffusion break pattern is lower than upper surfaces of the active fins.

10. The semiconductor device of claim 9, wherein the conductive structure contacts an upper surface of the first active fin and the upper surface of the first diffusion break pattern.

11. The semiconductor device of claim 1, further comprising:
    an isolation pattern formed on lower sidewalls of the active fins,
    wherein an upper surface of the first diffusion break pattern is coplanar with an upper surface of the isolation pattern.

12. The semiconductor device of claim 11, wherein the conductive structure contacts upper surfaces and upper sidewalls of the active fins, and the upper surface of the isolation pattern.

13. The semiconductor device of claim 1, wherein the first diffusion break pattern consists of an oxide and the second diffusion break pattern consists of a nitride.

14. The semiconductor device of claim 1,
    wherein the substrate includes first and second regions adjacent to each other in the second direction, and
    wherein the first and second diffusion break patterns are formed on the first and second regions, respectively, of the substrate.

15. The semiconductor device of claim 1,
    wherein the first diffusion break pattern is formed of a first layer having a first material composition that extends from an upper surface of the first diffusion break pattern to a lower surface of the first diffusion break pattern,
    wherein the second diffusion break pattern is formed of a second layer having a second material composition that extends from the upper surface of the second diffusion break pattern to a lower surface of the second diffusion break pattern, and
    wherein the first material composition is different from the second material composition.

16. A semiconductor device, comprising:
    a substrate provided with active fins, each active fin extending in a first direction, the active fins being spaced apart from each other and arranged side by side in a second direction;
    a first diffusion break pattern on the substrate, the first diffusion break pattern dividing a first active fin of the active fins into a plurality of pieces aligned in the first direction;
    a conductive structure on the first active fin and the first diffusion break pattern; and
    a second diffusion break pattern on the substrate, the second diffusion break pattern dividing a second active fin of the active fins into a plurality of pieces aligned in the first direction, and contacting the conductive structure; and
    an isolation pattern on the substrate, the isolation pattern formed on sidewalls of each of the active fins,
    wherein the second diffusion break pattern is not formed directly underneath the conductive structure, and
    wherein the conductive structure contacts an upper surface and an upper sidewall of the first active fin, an upper surface of the first diffusion break pattern, and an upper surface of the isolation pattern.

17. The semiconductor device of claim 16, wherein a lower surface of the second diffusion break pattern is lower than a bottom of the second active fin, and an upper surface of the second diffusion break pattern is higher than an upper surface of the conductive structure.

18. The semiconductor device of claim 16, wherein the maximum width of the second diffusion break pattern in the first direction is greater than the maximum width of the first diffusion break pattern in the first direction.

19. A semiconductor device, comprising:
- a substrate provided with first and second active fins, each of the first and second active fins extending in a first direction, the substrate including first and second regions adjacent to each other in a second direction, the first and second active fins being on the first and second regions, respectively, of the substrate;
- a first diffusion break pattern on the first region of the substrate, the first diffusion break pattern dividing the first active fin into a plurality of pieces aligned in the first direction;
- conductive structures extending in the second direction on the first active fin, the first diffusion break pattern, and the second active fin; and
- a second diffusion break pattern on the first and second regions of the substrate, the second diffusion break pattern dividing the first and second active fins into a plurality of pieces aligned in the first direction, and having a portion formed between portions of the conductive structures on the first and second regions of the substrate,
- wherein the second diffusion break pattern is not formed directly underneath the conductive structures, the second diffusion break pattern extends through the first diffusion break pattern, and a lower surface of the second diffusion break pattern is lower than a lower surface of the first diffusion break pattern.

* * * * *